United States Patent [19]
Hilton

[11] Patent Number: 4,996,530
[45] Date of Patent: Feb. 26, 1991

[54] STATISTICALLY BASED CONTINUOUS AUTOCALIBRATION METHOD AND APPARATUS

[75] Inventor: Howard E. Hilton, Snohomish, Wash.

[73] Assignee: Hewlett-Packard Company, Palo Alto, Calif.

[21] Appl. No.: 442,379

[22] Filed: Nov. 27, 1989

[51] Int. Cl.$^5$ ............................................. H03M 1/08
[52] U.S. Cl. .................................. 341/120; 341/107; 341/156
[58] Field of Search ............... 341/106, 107, 109, 118, 341/120, 131, 138, 140, 144, 155, 156, 158, 165; 364/554, 571.02

[56] References Cited

U.S. PATENT DOCUMENTS

| | | | |
|---|---|---|---|
| 4,328,552 | 5/1982 | Stovall | 364/554 |
| 4,342,983 | 8/1982 | Weigand et al. | 341/156 |
| 4,465,995 | 8/1984 | Sloane | 341/120 |
| 4,550,309 | 10/1985 | Hiller et al. | 341/131 |
| 4,583,075 | 4/1986 | Sloane | 341/120 |
| 4,612,533 | 9/1986 | Evans | 341/120 |
| 4,673,917 | 6/1987 | Urschel et al. | 341/118 |
| 4,734,678 | 3/1988 | Take et al. | 364/571.02 |
| 4,740,776 | 4/1988 | Sloane | 341/118 |
| 4,746,902 | 5/1988 | Tol et al. | 341/118 |
| 4,775,852 | 10/1988 | Sloane | 341/118 |
| 4,897,650 | 1/1990 | Shott, III et al. | 341/120 |
| 4,903,023 | 2/1990 | Evans et al. | 341/118 |
| 4,903,024 | 2/1990 | Evans et al. | 341/118 |

OTHER PUBLICATIONS

Bassi, "Pseudorandom Digital Cross Correlator for Impulse Response Measurements," Rev. Sci. Instrum., 51(6), Jun. 1980, pp. 795-798.

White et al., "Systematic Errors in Digital Cross Correlators Due to Quantization and Differential Nonlinearity," IEEE Transactions on Instrumentation and Measurement, vol. IM-36, No. 1, Mar. 1987, pp. 47-53.

*Primary Examiner*—William M. Shoop, Jr.
*Assistant Examiner*—H. L. Williams

[57] ABSTRACT

Errors in a sampled data process are discerned statistically throughout the process, permitting their efficient removal. An exemplary application is a subranging analog-to-digital converter (ADC), in which errors associated with component digital-to-analog (DAC) current sources are discerned and corrected automatically during the circuit's normal operation. This is achieved by continually introducing a random signal into the process, statistically examining the DAC output signal to discern error terms, and correlating the occurrences of these errors with the values of the random signal applied to the DACs so as to identify the current sources to which the error terms are due. The resulting ADC output signal is compensated to remove the random signal and is further compensated to remove the DAC error terms discerned by this statistical analysis. The effect of any errors that may remain due to imperfect quantification of the DAC error terms is minimized due to their randomization, permitting the removal of these error terms by averaging techniques.

26 Claims, 5 Drawing Sheets

FIG. 5
Xn → [F (Xn)] → Yn
FIG. 6
Xn → [F (Xn,P)] → Yn'
FIG. 7
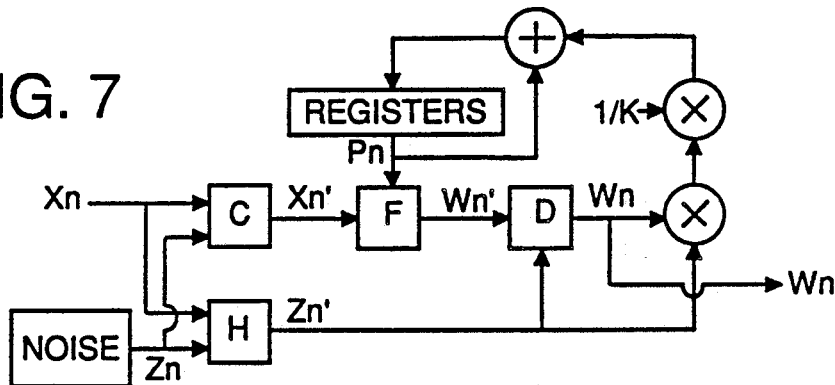
FIG. 9
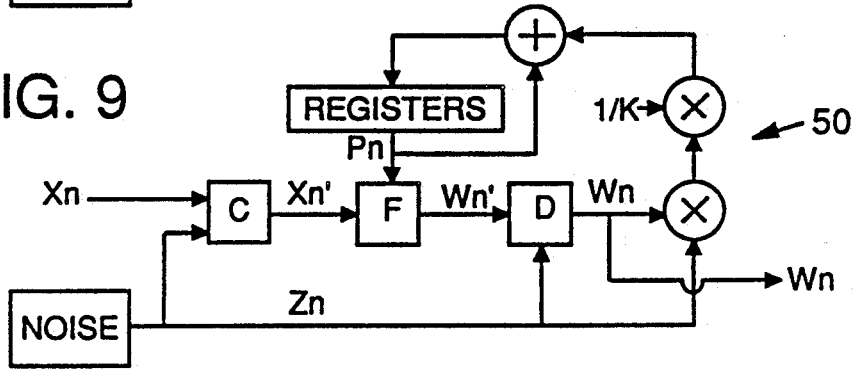
FIG. 10
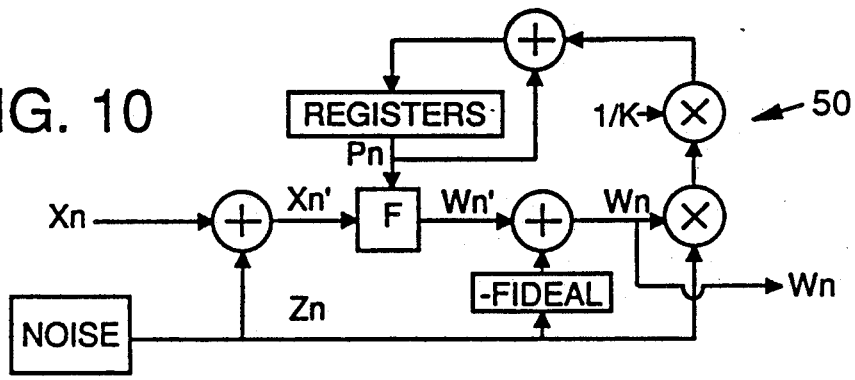
FIG. 11
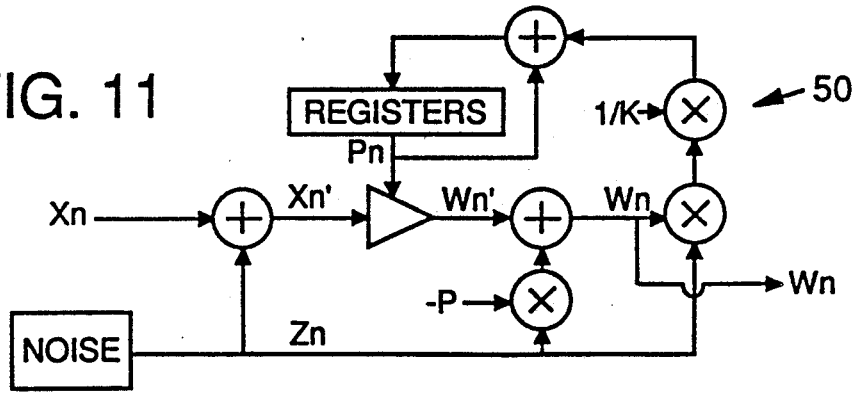

STATISTICALLY BASED CONTINUOUS AUTOCALIBRATION METHOD AND APPARATUS

FIELD OF THE INVENTION

The present invention relates to the calibration of sampled systems, and more particularly relates to the automatic statistical calibration of such systems to compensate for parameters that may cause such systems to deviate from ideal.

BACKGROUND AND SUMMARY OF THE INVENTION

For expository convenience, the present invention is described with reference to one illustrative application thereof, namely a system for removing conversion errors in a subranging analog-to-digital conversion circuit (ADC). It will be recognized, however, that the invention is not so limited.

A typical subranging ADC 10 is shown in FIG. 1. It includes a track and hold circuit 12, first and second ADCs 14, 16, a digital-to-analog converter (DAC) 18, a load 20, an amplifier 22, and a summer 24. In operation, an input analog signal is applied to the track and hold circuit 12. The output from this circuit tracks its input until a clock signal applied thereto causes the circuit to momentarily hold its output fixed. The first ADC 14 then converts this analog output signal into digital form, thereby providing a first approximation of the digitized value.

The digital output from ADC 14 is converted back into analog current form by the DAC 18, causing an error, or residual voltage to be developed across the load 20. This residual voltage is amplified by the amplifier 22 and converted into digital form by the second ADC 16. The accuracy of ADC2 is less critical than ADC1 since it is only operating on the residual or "subrange" of the original signal. In the FIG. 1 system, the errors of ADC2 are only one 64th as significant as errors in ADC1.

The summer 24 sums ADC1's first approximation of the input analog signal and ADC2's representation of the residual (appropriately adjusted for the gain of the amplifier) to provide a composite digital output signal.

The advantage of the subranging approach is that the accuracy of the result is dependent only on the accuracy of the DAC and ADC2, not on the accuracy of ADC1. The size of the residual is still a function of ADC1 accuracy but the accuracy of the residual is not. This shifts the primary accuracy requirements to the DAC instead of the ADC, taking advantage of the inherently higher accuracy of DACs for a given sample rate.

The principal limit on accuracy in subranging ADC 10 is the accuracy with which the DAC 18 converts the digital output of ADC1 14 back into analog form. The DAC 18 typically generates its output signals by controllably gating binarily weighted currents into a summation node in response to the bits of the digital input signal. The magnitudes of these component current sources are set by resistors internal to the DAC. High accuracies can be achieved by laser trimming each resistor in each DAC to achieve a desired measure of accuracy. However, such custom processing makes the DAC expensive and thus unsuitable for many applications. Mass produced DACs are much less expensive but can significantly compromise the accuracy of a subranging ADC.

To permit use of mass produced DACs in subranging ADCs, a technique has been developed wherein the error of each of the DAC current sources is quantified, and the resulting subranging ADC output signal is compensated for their cumulative error. FIG. 2 shows such a system. The correction circuit 26 includes a memory in which the error of each of the DAC's current sources is stored. By monitoring the digital signal applied to the DAC, the correction circuit 26 can determine the current sources that are active, calculate their cumulative error, and subtract this error from the final subranging ADC output signal.

While the foregoing technique provides high accuracy without precision DACs, it requires a calibration cycle in which each of the DAC current sources is individually operated, its output current compared against ideal reference values to quantify its error, and the error terms stored. One difficulty with this procedure is that of obtaining the requisite ideal reference values. More troublesome is the fact that the DAC errors change with age, temperature, and a variety of other factors, requiring recalibration periodically if accurate results are to be achieved.

To overcome these difficulties, the present invention provides a technique wherein the errors of the component DAC current sources are determined automatically during the circuit's normal operation. This is achieved, in a preferred form of the invention, by continually introducing a random signal into the process, statistically examining the DAC output signal to discern error terms, and correlating the occurrences of these errors with the values of the random signal applied to the DAC so as to identify the current sources to which the error terms are due. The resulting output signal is compensated to remove the random signal and is further compensated to remove the DAC error terms discerned by this statistical analysis.

The effect of any errors that may remain due to imperfect quantification of the DAC error terms is minimized because these errors are now random, permitting them to be removed by averaging techniques.

The foregoing and additional features and advantages of the present invention will be more readily apparent from the following detailed description thereof, which proceeds with reference to the accompanying drawings.

BRIEF DESCRIPTION OF THE DRAWINGS

FIG. 5 illustrates an ideal process.

FIG. 6 illustrates an actual process that includes a non-ideal process parameter P.

FIG. 7 is a schematic block diagram of a generalized embodiment of the present invention.

FIG. 9 illustrates an intermediate specialization of the generalized embodiment of FIG. 7 to a particular gain controlled amplifier embodiment.

FIG. 10 illustrates another intermediate specialization of the generalized embodiment of FIG. 7 to a particular gain controlled amplifier embodiment.

FIG. 11 is a schematic block diagram of an application of the generalized embodiment of FIG. 7 to a particular gain controlled amplifier application.

DETAILED DESCRIPTION

The subranging ADC with which the present invention is illustated minimizes errors associated with non-ideal digital-to-analog conversion by two techniques. The first is to automatically quantify the error of each of the DAC current sources so the final digital output signal can be compensated for their cumulative error. The second is to randomize any remaining errors that may be due to imperfect quantification (and thus compensation) of the DAC current source errors.

RANDOMIZATION

Figure 1:
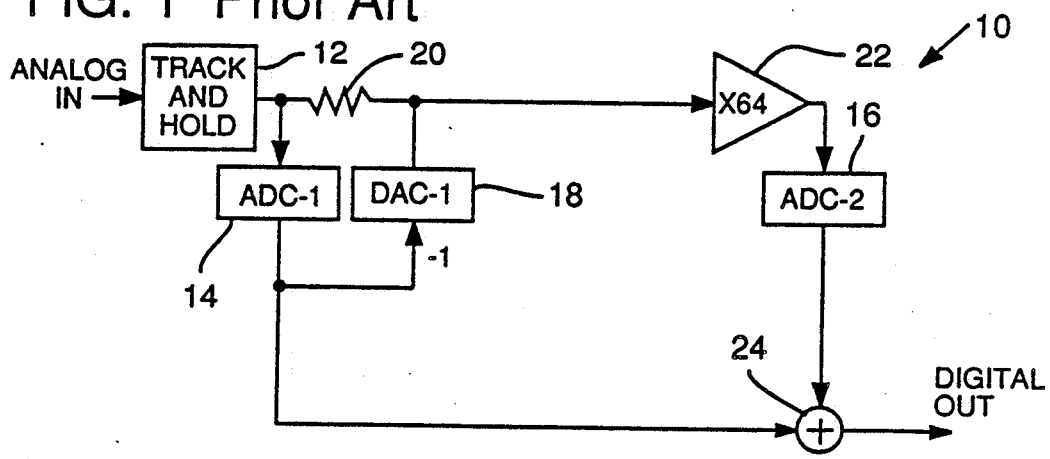
FIG. 1 is a schematic block diagram of a prior art subranging analog to digital converter circuit.
Figure 2:
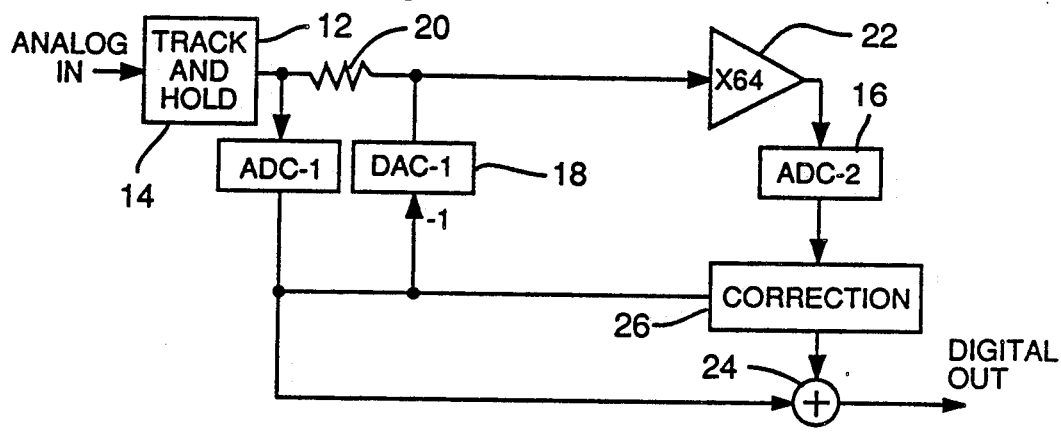
FIG. 2 is a schematic block diagram of a prior art subranging ADC that includes compensation to remove known DAC errors.
Figure 3:
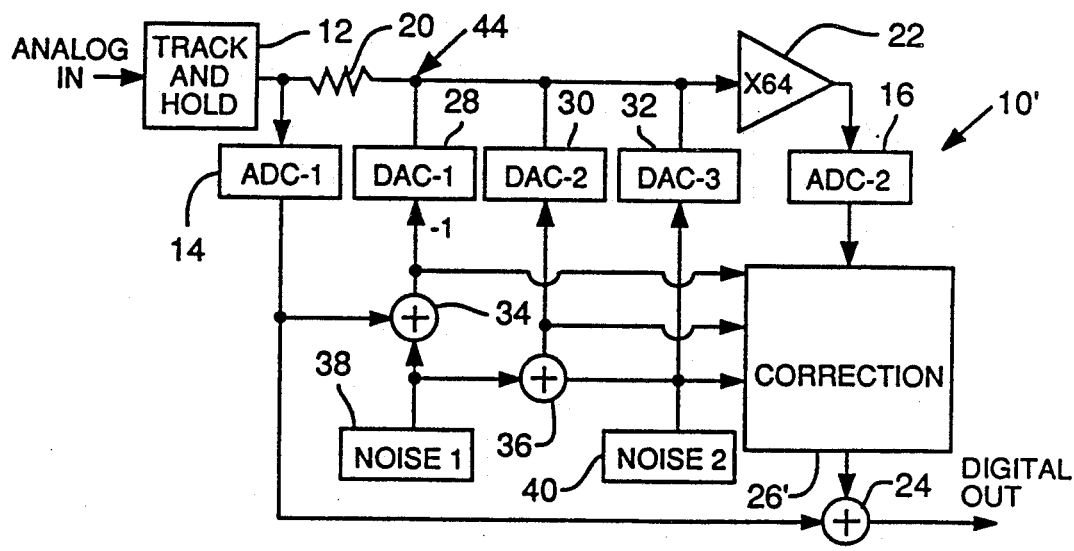
FIG. 3 is a schematic block diagram of a subranging ADC that includes statistical autocalibration according to one embodiment of the present invention.

FIG. 3 shows a subranging ADC 10' employing the techniques of the present invention. Taking the randomization technique first, the single DAC of FIGS. 1 and 2 is replaced by three DACs 28, 30, 32, two adders 34, 36, and two noise sources 38, 40. Since all three DAC current outputs are wired in parallel, the composite output is DAC1+DAC2+DAC3. (This summation is performed at a current node 44.) Assuming perfect DACs and tracing the DAC inputs back through the adders, the composite output can be seen to be −(ADC1+NOISE1)+(NOISE1+NOISE2)−−(NOISE2), or −ADC1. This is the same effective DAC output as in the subranging ADC of FIG. 1 if the three DACs are perfectly accurate. The difference arises when the DAC errors are considered.

In the subranging ADC of FIG. 1, DAC1 is driven directly by the output of ADC1, which in turn is directly determined by the sampled input voltage. In that case, any errors produced by the DAC are repeatably generated for any given input voltage. Consequently, the inaccuracies of the overall A/D converter system are repeatable and signal dependent. This means that even if multiple measurements are made of a certain signal, the errors cannot be averaged away since they are signal dependent and are repeated in all measurements.

In the randomized converter illustrated in FIG. 3, each DAC current source is driven by a bit stream which is determined by pure noise, or by noise combined with signal bits. If the noise signals are appropriately selected, only the most significant bit of DAC1 has any correlation with the input signal. This means that errors due to any of the other bits are injected in a manner completely independent of the input signal. The result is a noise-like error which can be averaged away using multiple A/D measurements. This characteristic is very beneficial in many applications. Even though this benefit alone is very important, a possibly more significant outcome is that this scheme provides a straight forward technique of determining the DAC current source errors for calibration.

AUTOCALIBRATION

The autocalibration technique employed in the present invention relies on two statistical properties of the system's signals. The first is that the digital input bits applied to the three DACs are random (with the exception of the MSB of DAC1, as mentioned above). Consequently, it is equally probable during any given conversion cycle that any given input bit may be a "1" or a "0". The second statistical property is that the final output signal from the A/D converter is uncorrelated to the values of the DAC input bits, since the input bits are randomized. (The interconnection of the three DACs in the manner illustrated cancels out the random noise component from the final output signal, as noted above.) Due to these two conditions, it is known that the long term average of the system output signal when a given input bit of a DAC is a "1" should be exactly the same as the long term average of the output signal when the given input bit is a "0".

If the long term average of the output signal when the given input bit is a "1" is not exactly equal to the long term average of the output signal when the input bit is a "0", then one of the two statistical assumptions is incorrect. If the randomization of the digital input bits is truly a random process, then the assumption that "1"s and "0"s are equally likely is known to be correct. Consequently, any variance between the two long term averages must be due to a violation of the other assumption. Namely, there must be some correlation between the value of the given DAC input bit and the system output signal.

Such a correlation may be due to a variety of factors. However, the dominant factor is the error by which the magnitude of the DAC current source differs from its ideal value. Assuming for a moment that all of the DAC current sources except one are ideal, and that this one current source is slightly larger than it should be, it may be recognized that the system's long term average output signal when that current source is energized will be slightly larger than the long term average output signal when that current source is idle. This is due to the slight additional current associated with this current source (but none of the others) that is added to the final output signal each time this current source is energized but is not added when it is idle. By examining the behavior of the output signal over the long term and correlating its behavior with the value of a given DAC input bit, the error of the associated DAC current source can be discerned.

This correlation is effected by adding a greatly diminished version (i.e. by a factor of thousands or millions) of the corrected output signal to the error value stored in the correction circuit 26' if the corresponding DAC input bit is a "1", and subtracting the same value if the corresponding DAC input bit is a "0". If the long term average of the output signal when the bit is a "1" is the same as the long term average when the bit is a "0", these additions and subtractions will cancel, leaving an error term of substantially zero. However, if one of the two long term averages is larger than the other, this difference will be manifested as a non-zero accumulation of these added and subtracted values, thereby providing a correction value that can be subtracted from the output signal whenever that DAC input bit is energized.

An analogy may be made to a statistical examination of the process of wagering on a coin toss. If a bettor wins $1.01 each time he calls the coin toss correctly but loses only $1.00 when he calls it incorrectly, he will not break even over the long term. Rather, he will come out ahead. A statistician who knows the bettor's winnings (or losses) over the long term can discern the difference between the two figures. If, after a million coin flips, the bettor has accumulated net winnings of $10,000, and the statistician knows the bettor loses $1.00 each time he calls the coin toss incorrectly, the statistician can compute that the bettor must win $1.01 each time he calls the toss correctly. The present invention relies on basically the same principle.

It will be recognized that, unlike the prior art, in which the error term of each current source is determined by comparison with a known current source, the "known" in the present invention is the expected statistical behavior of the output signal over the long term as a function of each DAC input signal. By using this "known" as a basis for comparison, the error of each of the DAC current sources can be determined and can be subtracted out using prior art techniques.

The resulting A/D converter thus has several advantages. First is that the DAC errors are determined automatically during the system's normal operations and the resulting output signal is compensated to remove their effect. The second is that any remaining errors are randomized, permitting their substantial removal by time averaging techniques.

An appendix at the conclusion of this specification contains a mathematical analysis establishing the effectiveness of the foregoing methodology and detailing the necessary and sufficient conditions. The following discussion summarizes these conditions, particularly as they relate to the noise source characteristics, and reviews the details of an illustrative implementation.

NOISE SOURCE DETAILS

The proper operation of the autocalibration technique depends on the statistical characteristics of the noise signals. If ADC1 has N bits of resolution, then NOISE1 and NOISE2 should have $N+1$ and N bits of resolution respectively. In the illustrated embodiment, all three of these digital signals are encoded as positive binary integers. If the converter is to be used for both positive and negative input signals, the conversion range of ADC1 must be offset such that a zero volt input produces a half scale output. This offset can then be accounted for in the interpretation of the final digital output. Since such an offset has no effect on the operation of the technique being described, it will be ignored in this discussion, and the converter will be described as handling positive inputs only.

The N bits of NOISE2 are generated using N independent one-bit random binary sequence generators which are interpreted collectively as an N-bit binary coded random integer. Since all the bits are independent of each other, all states are equally likely and NOISE2 is uniformly distributed in the range from 0 to $2^N-1$.

The $N+1$ bits of NOISE1 are similarly generated using $N+1$ independent one-bit random binary sequence generators. N of these are interpreted as an N-bit binary coded random integer. The remaining random bit (0 or 1) is then added to this random integer. The resulting range of NOISE1 is then 0 to $2^N$, requiring $N+1$ bits for encoding. For ease of implementation, the required addition can be combined with adders shown in the block diagram rather than by using a separate adder inside the NOISE1 source. This is done by connecting the extra random bit to the carry-in of each of the two adders.

Considering the range of inputs into the adders, the range of outputs is 0 to $2^{(N+1)}-1$ driving DAC1, 0 to $2^{(N+1)}-1$ driving DAC2 and $2^N-1$ for DAC3. This implies that the number of bits of resolution for DAC1, DAC2 and DAC3 are $N+1$, $N+1$ and N, respectively. Because of the way the NOISE signals are generated and combined with the adders, the statistical relationships between the individual bits streams can be computed, as shown in the concluding appendix.

CORRECTION DETAILS

Figure 4:
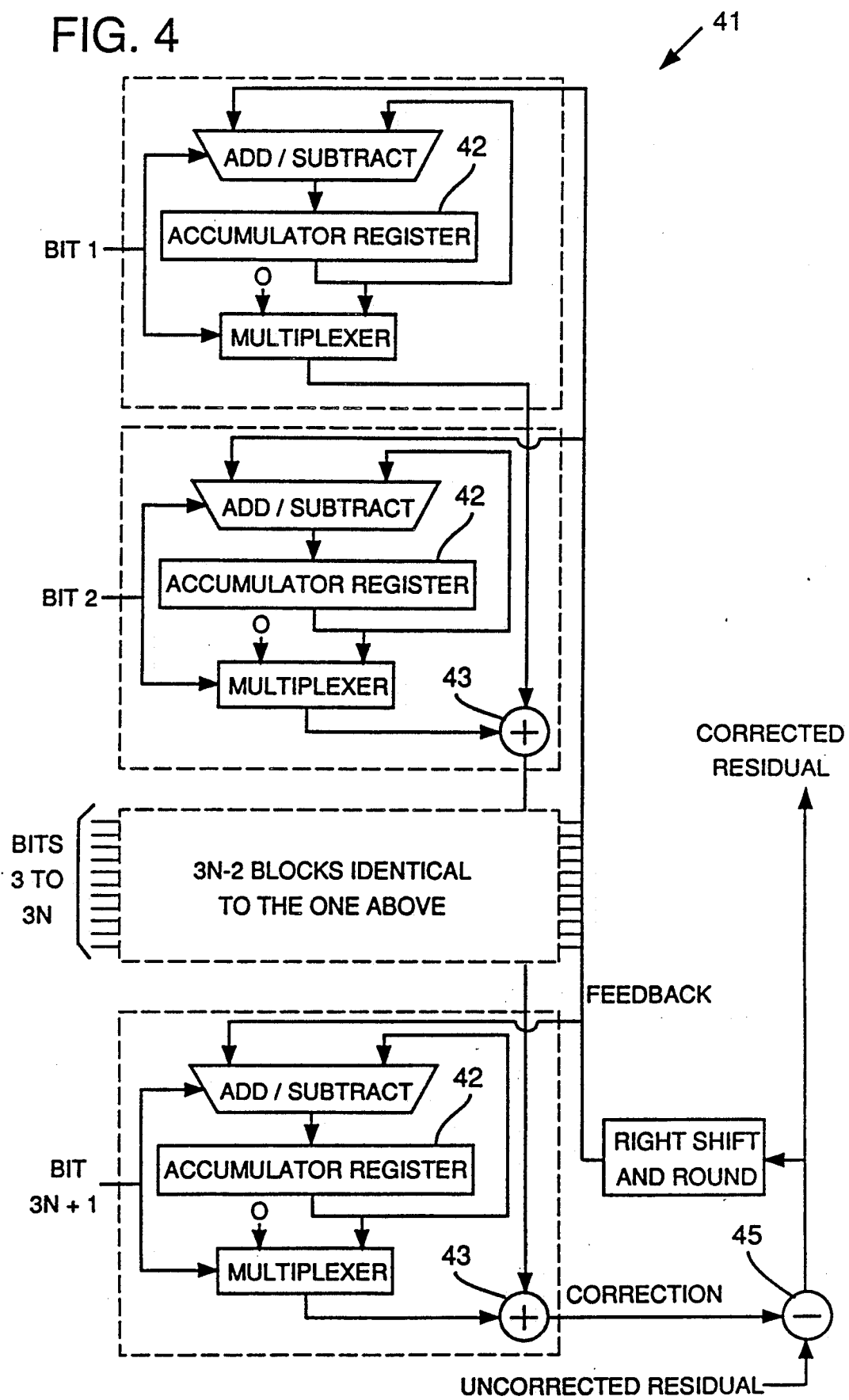
FIG. 4 is a schematic block diagram of a correction circuit used in the subranging ADC of FIG. 3.

The errors associated with each of the DAC current sources by the calibration technique are expressed in terms of their deviation from some reference. The choice of reference is not important as long as all the current source errors are consistently computed relative to that reference. The chosen reference becomes the "absolute" standard against which the sampled signal is measured. For this technique, the reference is chosen to be the current source associated with the most significant bit of DAC1. This current reference is the absolute standard against which the signal current through the resistor 20 is measured. Since this current source is "perfect" by definition, it has no error and does not have to be calibrated. All the other $N+1$ bits used in the three DACs must be calibrated relative to the most significant bit of DAC1. The hardware 41 used in the correction circuit 26' to apply the calibration is shown in FIG. 4.

Each of the $3N+1$ current sources to be calibrated has associated with it in correction circuit 26' an accumulator register 42 which holds the error of that particular current source. Since the desired correction accuracy is better than the original DAC resolution, the resolution of the accumulator must be finer than the resolution of the DAC. For the purpose of this discussion, each accumulator 42 may be considered to store a fixed point two's complement binary number with M bits to the right of the point. The bit immediately to the left of the point is equivalent in significance to the LSB of ADC1, NOISE1 and NOISE2.

For each A/D conversion cycle, the first step in the correction technique is to compute the correction needed for that sample. This is done by adders 43 that sum up the values in all the accumulator registers associated with the current sources which are on for that sample, i.e. all the DAC bits driven with a "1". This correction value is then subtracted by a circuit 45 from the output of ADC2 to give a corrected residual output. This corrected residual must be computed to the full resolution of M bits to the right of the point.

The second step of the calibration technique is to update the accumulator registers with new estimates of the current source errors. This is done by dividing the corrected residual by a smoothing factor of $2^k$ to achieve a feedback signal that tweaks the error constants stored in the accumulators. The choice of a power of two makes the division a simple right shift of the binary representation of the corrected residual. After the right shift, the feedback is rounded to M bits to the right of the point. Each of the $3N+1$ accumulator registers is updated by adding or subtracting the feedback from the previous contents of the accumulator register. The choice of adding or subtracting depends on whether the DAC bit driving the current source associated with the register was a "1" or a "0" for the current sample. If the bit was a "1", an add is performed. If the bit was a "0," a subtract is performed. The concluding appendix shows how this technique yields the correct value of the current source errors in the accumulator registers.

In selecting the smoothing factor $2^k$, there is a tradeoff between accuracy and the speed with which the technique can track changes to the DACs caused by aging, temperature, etc. Choosing very large smoothing factors reduces the variance of the current source error estimates held in the accumulator registers, giving more precise corrections. However, the time constant for tracking changes in a DAC is proportional to the sample period multiplied by the smoothing factor. Therefore, if the smoothing factor is set too large, the accumulator register may not contain a very accurate error estimate for a changing DAC error. Practical values for the smoothing factor range from $2^{10}$ to $2^{25}$.

CONCLUSION ON SUBRANGING A/D CONVERSION

The illustrated correction technique has significant advantages over currently used techniques in that an error model is generated and kept current without having to pause for a calibration cycle. The error model tracks relatively fast-moving changes in the DACs, allowing for greater precision. The DAC bits, excluding the most significant bit of DAC1, are driven with noise-like signals which are signal independent, eliminating potential self heating errors which are signal dependent. Most remaining errors which are not removed are randomized across the entire frequency spectrum, allowing for further accuracy improvement using averaging.

GENERALIZED CASE

It will be recognized that the principles employed in the above subranging A/D converter example can be advantageously employed in a variety of other applications. Nearly any sampled process that deviates from ideal due to correctable process parameters can be corrected in this manner.

An ideal process to which the methodology of the present invention may be applied may be represented as:

$$F(X_n) = Y_n$$

where $X_n$ is an input signal and $Y_n$ is a corresponding scaler output signal. This ideal process is represented by FIG. 5.

The process actually includes one or more adjustable process parameters $P_n$ that cause the actual process to deviate from ideal. Consequently, the actual process is represented as:

$$F(X_n, P_n) = Y_n'$$

where $X_n$ is the input, $P_n$ is a vector representing the adjustable parameters for the corresponding sample, and $Y_n'$ is the output of the actual process corresponding to $(X_n, P_n)$. The process is such that:

$$F(X_n) = F(X_n, P)$$

where P is a fixed vector representing ideal process parameters. This actual process is represented by FIG. 6.

The application of a generalized form of the invention to correct this non-ideal process is illustrated in FIG. 7 and follows the following basic steps. First, a random vector $Z_n$ is provided. Next, a preprocessing operation C is performed on the input signal and random vector $(X_n, Z_n)$ to yield an randomized version $X_n'$ of the input signal. This randomized signal is then combined with the adjustable parameter $P_n$ and processed by the actual process F to yield an output $W_n'$. (That is, $W_n' = F(X_n', P_n)$.)

A second operation H is also performed on the original input signal $X_n$ and the random signal $Z_n$ to yield a vector output signal $Z_n'$. (That is, $H(X_n, Z_n) = Z_n'$.)

Finally, an operation D is performed on the signals $(W_n', Z_n')$ to yield a corrected output $W_n$.

The operations C, H and D are chosen such that:

$$W_n = Y_n = F(X_n, P) = D(F(C(X_n, Z_n), P), H(X_n, Z_n))$$

and the sign of each element of the expected value of $[W_n Z_n']$ is the same as the sign of the corresponding element of the expected value of $[P_n - P]$.

Figure 8:
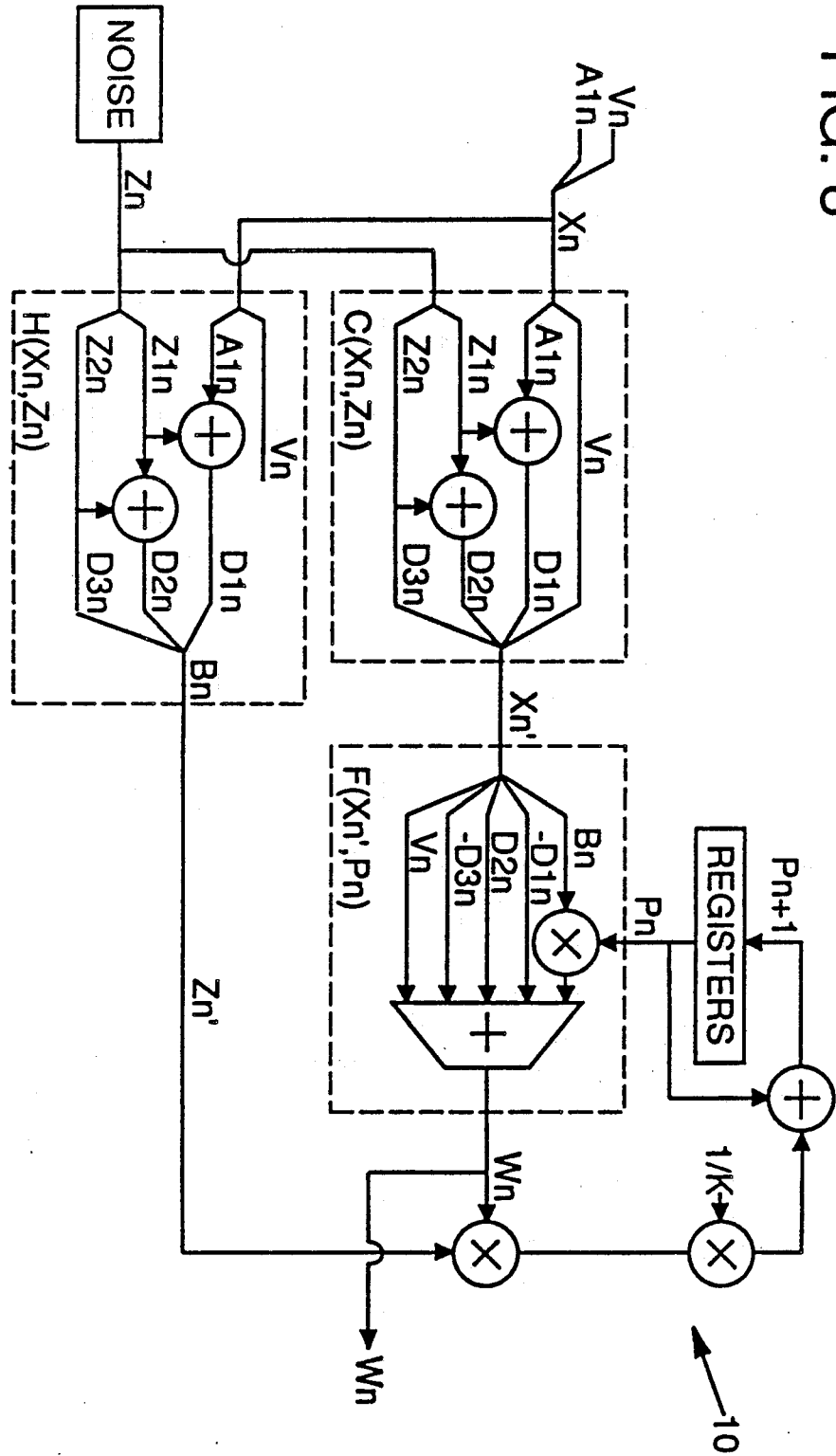
FIG. 8 is the schematic block diagram of FIG. 7 annotated to detail the correspondence of its generalized functional blocks to their particular functions in the subranging ADC of FIG. 3.

The foregoing generalization will be made more clear by its application to the particular subranging A/D converter 10' detailed earlier. This discussion proceeds with reference to FIG. 8, which is the generalized block diagram of FIG. 7 annotated to detail the correspondence of the generalized functional blocks with their particular functions in the specific A/D converter example.

It may first be recognized that variable $X_n$ here is a vector comprised of two components: the analog signal to be converted into digital form and a digital approximation of that analog signal. These components are labelled $V_n$ and $A1_n$, respectively in FIG. 8. $P_n$ is a set of adjustable parameters which models the conversion errors associated with the analog-to-digital conversion process (i.e. the DAC current source errors stored in the accumulators 42); and $Z_n$ is a two-component vector of digital noise integers $Z1_n$ and $Z2_n$. The generalized preprocessing function C is the combination of the input signal $X_n = (V_n, A1_n)$ with noise signals $Z_n = (Z1_n, Z2_n)$, i.e. $C(X_n, Z_n) = X_n + Z_n = (V_n, D1_n, D2_n, D3_n)$, where $D1_n = A1_n + X1_n, D2_n = X1_n + X2_n$, and $D3_n = X2_n$.

The generalized function D is simply an identity function, so that $W_n' = W_n$.

The generalized function H yields a vector output of $-1$ or 1 values corresponding, respectively, to the (0,1) values of the individual bits of the binary representation of D1, D2 and D3, exclusive of the most significant bit of D1.

Finally, the generalized function F is the sum of the analog signal $V_n$, the output of three ideal D/A converters driven by $-D1_n, D2_n$, and $-D3_n$, and an error component for each D/A converter bit modeled by the dot product $B_n \cdot P_n$.

The concluding appendix shows that by using these substitutions, the resulting $W_n$ is an accurate digital representation of the difference between the analog component of the input $V_n$ and the digital estimate component $A1_n$. Thus, by adding $A1_n$ and $W_n$, an accurate final digital representation of $V_n$ is achieved.

As noted, the present invention has numerous applications beyond the illustrated A/D converter 10'. FIG. 11 shows a simple example-that of a gain controlled amplifier 50. In this case, there is only one adjustable parameter $P_n$, namely the amplifier gain. The ideal amplifier function F is $F(X_n, P_n) = X_n P_n = W_n$. In this case, the input signal is again combined with a noise signal $Z_n$, and this signal is passed through the non-ideal amplifier. The resulting output signal $W_n'$ is processed by subtracting out the noise signal that has been correspondingly amplified. The remaining signal is then examined for correlation with the random input data by the same technique used above, namely by adding or subtracting (depending on the random signal) a weighted version of the output signal from an accumulator register that determines the amplifier gain.

FIGS. 9–10 show the series of substitutions by which the generalized diagram of FIG. 7 is specialized into the gain controlled amplifier application of FIG. 11. FIG. 9, for example, shows that the function H here is simply an identity function for the input random signal. That is, $H(X_n, Z_n) = Z_n' = Z_n$. FIG. 10 shows that the function C here simply combines the input signal $X_n$ with the noise signal $Z_n$.

Having described and illustrated the principles of my invention with reference to an illustrative embodiment thereof, it will be apparent that the invention can be modified in arrangement and detail without departing from such principles. Accordingly, I claim as my invention all such modifications as may come within the scope and spirit of the claims following the appendix and equivalents thereto.

APPENDIX

The following discussion contains a mathematical description of the statistically based correction methodology used in the illustrated subranging A/D converter. This description establishes that the claimed methodology effectively removes the effects of errors in the digital-to-analog converter (DAC) current sources. The description also illustrates that any errors which remain after the methodology is applied can be represented as white noise. The discussion proceeds with reference to FIG. 12.

Figure 12:
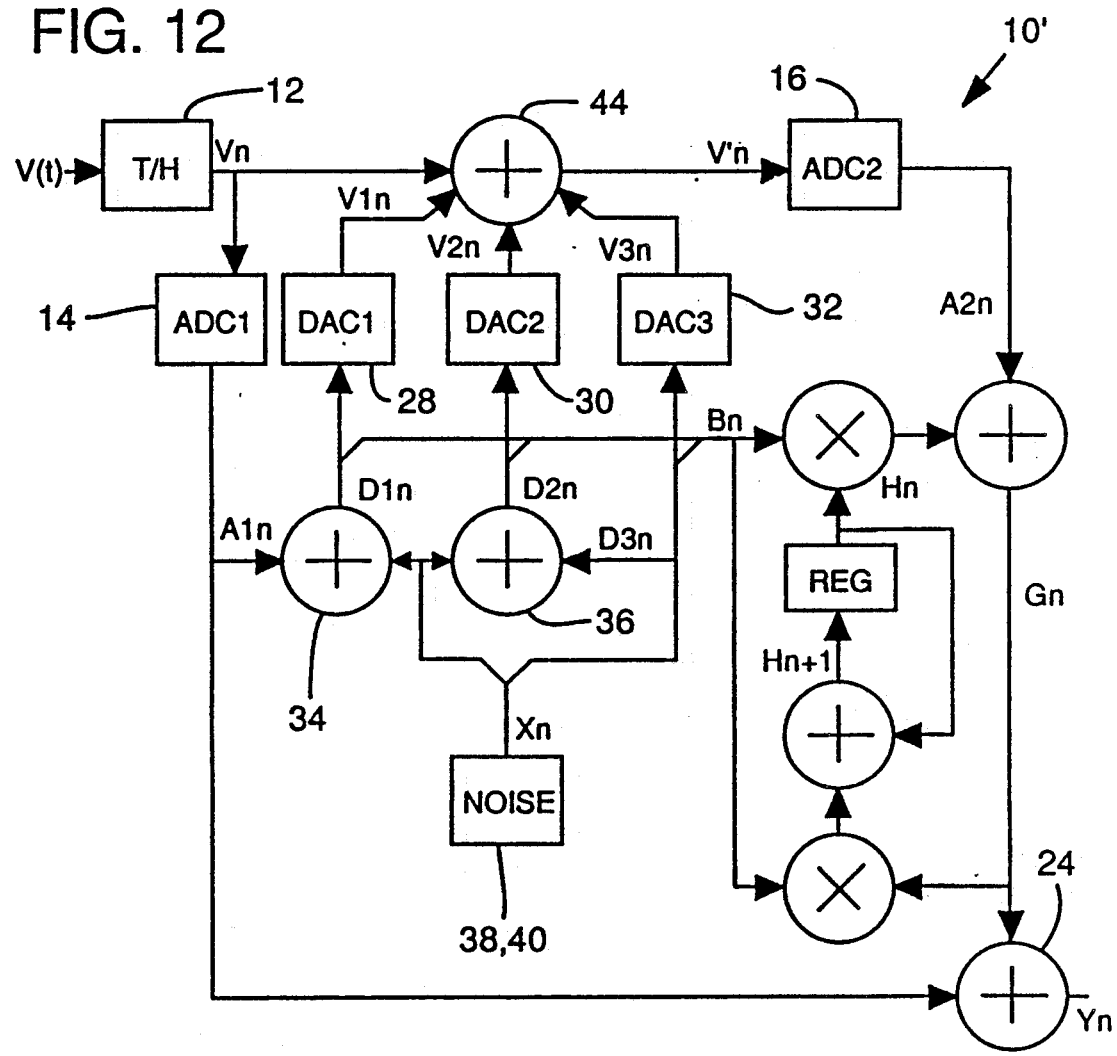
FIG. 12 is an annotated schematic block diagram of the subranging ADC of FIG. 3 referenced in the concluding appendix.

BLOCK DEFINING EQUATIONS:

The following equations describe the functional blocks of FIG. 12 in terms of their input-output relations.

T/H: Track and Hold

As noted, the track and hold block 12 takes a continuously changing voltage as an input and generates a sequence of sampled voltages on the output. Both the input and output voltages can take on values with arbitrarily fine resolution and are therefore represented as real numbers. The range of voltages on the input and output are assumed to be limited to the range of $\pm RI_0/2$, where $I_0$ is the value of the MSB current source in DAC1, and R is an arbitrarily selected voltage to current scale factor to achieve the desired input range. Errors in the track and hold circuitry are not affected by the claimed methodology and are therefore not addressed in this discussion.

Expressed mathematically, the track and hold circuit 12 has the following properties:

$v(t)$ = A continuous real function of t, representing the signal input voltage vs time.

$v_n = v(t_n)$ where:

$t_n$ = A sequence of times at which the input is sampled;

n = An integer indexing a particular sample in the sequence; and $$-\frac{RI_0}{2} \leq v_n < \frac{RI_0}{2}$$

ADC1: Analog-to-Digital Converter 1

The first ADC 14 converts the sampled voltage from the track-and-hold circuit 12 into a binary integer. The integer is constrained to be encoded with N bits, thus making this representation a rather coarse approximation of the sampled input voltage. The errors associated with this coarse representation of the voltage are carried through the analysis as $E_{1n}$. This allows verification that these errors are ultimately eliminated through the traditional use of a two-pass (subranging) converter approach. It also allows verification that these errors will not adversely effect the operation of the DAC error correction methodology which is the focus of this analysis.

$$A_{1n} = \left( \frac{v_n}{RI_0} + \frac{1}{2} \right) 2^N - E_{1n}$$

where:

$A_{1n} \epsilon$ Integers $0 \leq A_{1n} \leq 2^N - 1$

N = the number of bits in ADC1

$E_{1n}$ = the error associated with the ADC1 conversion, and $|E_{1n}| \leq 1$.

NOISE: Noise sequence generator

The purpose of the noise generator 38, 40 is to produce 2N+1 uncorrelated binary noise sequences which are used to generate random integers which can be combined with ADC1 outputs to drive the DACs. At times in the following analysis it will be easier to consider the noise as individual random bit sequences denoted as $X_{in}$. At other times it will be easier to consider them as binary representations of integers $D_{3n}$ and $D_{4n}$. When using the individual bit notation, many of the Boolean operations which would normally occur in describing logic operations can be more conveniently represented in algebraic form if the states of $x_{in}$ are taken as $\pm 1$ rather than the traditional 0,1 states. This eases the calculation of correlation between bits.

$$X_n = \begin{bmatrix} x_{1n} \\ x_{2n} \\ \ldots \\ x_{2N+1} \end{bmatrix}$$

where:

$x_{in} \epsilon \{-1, 1\}$ is a zero mean random sequence with the statistical properties indicated in the following formula:

$$\delta_n[x_{in} b_n] = 0$$

where:

$b_n$ is any sequence which is not a function of $x_{in}$, including functions of $x_{im}$ where $m \neq n$.

Note that the implications of the constraint on the expected values above are considerable. First, if $b_n = 1$, then this constraint requires that each bit sequence has a 50% probability in each of its two states. Second, if $b_n = x_{i,n+m}$ where $m \neq 0$, the implication is that each sequence is "white," in that it has a uniform spectral density. Third, the formula requires that each sequence be totally independent of all other sequences and of arbitrary combinations of all other sequences. Finally, the sequences must be independent of the sampled voltage sequence. This constraint becomes very powerful when computing expected values of sequences which are functions of $X_n$ since any term which can be factored into the form given above will have zero contribution to the expected value and can therefore be ignored. Whenever this technique is applied subsequently in this discussion, it will be referred to as the "orthogonality criteria." The technique used to generate the bit sequences meeting the orthogonality criteria will not be described here since a variety of approaches may be used. Fortunately, a strict adherence to the criteria is not absolutely necessary for the claimed methodology to work correctly. When considering techniques for generating the noise, the following analysis may be consulted to see where the criteria is applied and therefore which orthogonality conditions are really necessary.

At times it will be more convenient to treat the noise outputs as binary representations of integers rather than merely a sequence of uncorrelated bits. For those cases, the integer sequences $D_{4n}$ and $D_{3n}$ can be defined as follows:

$$D_{4n} = \frac{X_{N+1,n} + 1}{2} + \sum_{i=1}^{N} \frac{x_{in} + 1}{2} 2^{N-i}$$

where:
$D_{4n} \epsilon$ Integers, $0 \leq D_{4n} \leq 2^N$ $$D_{3n} = \sum_{i=1}^{N} \frac{x_{N+1+i,n} + 1}{2} 2^{N-i}$$

where:
$D_{3n} \epsilon$ Integers, $0 \leq D_{3n} \leq 2^N - 1$.

Adders:

The adders 34, 36 described in this appendix are those which combine the ADC1 output with the noise sequences described above. Again it will sometimes be convenient to think of the outputs as integers, denoted $D_{1n}$ and $D_{2n}$. At other times all three DAC drive signals will be represented as a sequence of binary vectors $B_n$. In the latter case, the binary states will again be labeled using the $\pm 1$ convention. Note that the definition of $D_{2n}$ implies a bit inversion after the addition of $D_{4n} + D_{3n}$.

$$D_{1n} = A_{1n} + D_{4n}$$

$$D_{2n} = 2^{N+1} - (D_{4n} + D_{3n}) - 1$$

$$B_n = \begin{bmatrix} b_{1n} \\ b_{2n} \\ \ldots \\ b_{3N+1,n} \end{bmatrix}$$

where:
$b_{in} \epsilon \{-1,1\}$, and satisfy the following conditions:

$$D_{1n} = \sum_{i=0}^{N} \frac{b_{in} + 1}{2} 2^{N-i}$$

$$D_{2n} = \sum_{i=0}^{N} \frac{b_{N+1+i,n} + 1}{2} 2^{N-i}$$

$$D_{3n} = \sum_{i=1}^{N} \frac{b_{2N+1+i,n} + 1}{2} 2^{N-i}$$

DAC1, DAC2, DAC3: Digital-to-analog converters and analog summation

The digital-to-analog converters 28, 30, 32 are assumed to be constructed as a set of independent binary weighted current sources with the outputs summed together in the analog adder (i.e. current node). The analog adder combines the DAC current outputs with the sampled input voltage to produce a residual voltage labeled $v'_n$. The main thrust of this aspect of the calibration methodology is to eliminate the effects of inaccuracies in the binary weighting of the current sources in the DACs. A key assumption is that each binary bit entering the three DACs controls an individual current source which has a value $c_i$ independent of n and independent of the state of all other DAC bits. Although the $c_i$ values nominally are binary weighted within each DAC, this is not necessary. The methodology will remove the errors associated with deviations from this ideal binary weighting. The following formula gives the composite effect of all three DACs combined with the analog adder. No additional error mechanisms other than the DAC current errors are modeled in this analysis. Note that the C vector does not include an entry for the current source driven by $b_{0n}$—the most significant bit of DAC1. This is because this current source is defined to be $I_0$ and there is no need to define a $c_0$ to allow for errors in this bit relative to itself.

$$v_n' = v_n - \frac{RI_0}{2}(b_{0n} + 1) -$$

$$\frac{RI_0}{2}(B_n^T + I^T)C + \frac{5RI_0}{2} - \frac{RI_0}{2^N}$$

where:
I is a unit column vector, and $$C = \begin{bmatrix} c_1 \\ c_2 \\ \ldots \\ c_{3N+1} \end{bmatrix}$$

where:
$c_i$ is a real number; and
$I_0 c_i$ represents the current associated with the ith DAC bit which is driven by $b_{in}$.

ADC2: Analog-to-Digital Converter 2

The purpose of the second ADC 16 is to convert the residual voltage from the analog adder into digital form. Because of the finite number of bits in ADC2, the output becomes a quantized approximation of the real value of the residual. The error in this quantization will be denoted as $E_{2n}$ and is carried through the remainder of the analysis in order to show that it has no adverse effect on the correction algorithm. Normally, the residual voltage range is considerably smaller than the original input voltage. This allows ADC2 to operate over a smaller voltage range than ADC1, making $|E_{2n}| << |E_{1n}|$. The particular encoding scheme used for ADC2 is not important, although for this analysis it is assumed that the output is bipolar and centered around 0.

$$A_{2n} = \frac{2^N v_n'}{RI_0} + E_{2n}$$

where:
- $A_{2n}$ is a rational number encoded in M bits from ADC2; and
- $E_{2n}$ = the error in quantizing the real number $v_n'$ to a rational representation.

Correction Circuitry:

The purpose of the correction circuitry 26 is to correct each sample of the quantized residual by adding an appropriate correction for each bit which drove the DAC current sources when that sample was taken. By doing this, the DAC current errors can be removed. Even though the DAC model described above implies that a DAC current error only occurs with the drive bit equal to 1, the correction is applied for both the 1 and −1 states. Although this seems counter-intuitive, it actually yields better statistical properties for the errors inherent in the correction algorithm. The corrections applied to the residual are based on an error table which stores a representation for the error of each DAC bit relative to the MSB of DAC1. There is no correction applied for the MSB of DAC1 since it is defined as the reference $I_0$. The generation and updating of the error table will be described in the following section.

$$G_n = A_{2n} - B_n^T H_n$$

where:
- $H_n$ is a rational vector described below; and
- $G_n$ is a rational scaler.

Correlation:

The purpose of the correction hardware 41 is to update the correction vector, $H_n$, based on the corrected residual and on the DAC drive bits for the current sample. This block maintains a running accumulation of the corrected residual times each DAC drive bit. If there is a correlation between these two sequences, the stored correction value will integrate to a new value until the correlation disappears. When the corrected residual no longer correlates to any of the DAC bits, the correction vector contains the appropriate values to offset the DAC current errors. The fact that this occurs and that the vector is independent of the input signal will be shown later.

$$H_{n+1} = H_n + B_n \frac{G_n}{K}$$

where:
- $H_n$ is a vector of rational numbers; and
- $K$ is a large integer.

Output Adder:

The output adder 24 combines the coarse quantization results from ADC1 with the corrected residual to generate the composite digitized output from the converter.

$$Y_n = A_{1n} + G_n$$

DERIVATION OF RESULTS

The following discussion contains the derivation of the output signal in terms of the above definitions. Only the main flow of the derivation is given in this section, while details for specific steps are given in the following section labeled Supporting Derivations.

The first part of this analysis calculates the deterministic portion of the output. The second part then examines the nature of the random noise which is inherent in the system.

Computation of $G_n$, $H_n$, and $Y_n$:

Using the defining equations from the previous section, the output $Y_n$ can be computed in terms of $v_n$. Since $A_{1n}$ is already defined in terms of $v_n$, the challenging part of this derivation is to determine the corrected residual, $G_n$, in terms of $v_n$. The defining equation for $G_n$ can be expanded by substituting in the definitions for $A_{2n}$ and then $v_n'$. Regrouping and factoring yields the following result.

$$G_n = 2^N \left[ \frac{v_n}{RI_0} - \frac{b_{0n}+1}{2} - \frac{(B_n^T + I^T)}{2}(C + 2^{1-N}H_n) + \frac{5}{2} \right] - 1 + E_{2n} + I^T H_n$$

The factor $(C + 2^{1-N}H_n)$ becomes, in effect, the corrected current source weights for the DAC bits relative to the MSB of DAC1. These corrected bit weights will be designated as $W_n$. Ideally $W_n$ would not change versus n and would be binary weighted values within each DAC. In order to see if the correction algorithm approaches this condition, the characteristics of $W_n$ must be derived. This may be done by taking the defining equation for $H_n$, multiplying both sides by $2^{1-N}$, adding C to both sides, and substituting in $W_n$ and $G_n$. The resulting equations for the corrected residual, $G_n$, and the effective bit weights, $W_n$, are:

$$G_n = 2^N \left[ \frac{v_n}{RI_0} - \frac{b_{0n}+1}{2} - \frac{B_n^T + I^T}{2} W_n + \frac{5}{2} \right] - 1 + E_{2n} + 2^{N-1}I^T(W_n - C)$$

where: $W_n = C + 2^{1-N}H_n$ $$W_{n+1} = \left(I - \frac{B_n B_n^T}{K}\right) W_n + \frac{B_n}{K}\left(\frac{2v_n}{RI_0} - b_{0n} - I^T C + 4 - 2^{1-N} + 2^{1-N}E_{2n}\right)$$

The recursive equation for $W_n$ can be solved by breaking $W_n$ down into a non-varying component, $W$, and a zero mean varying component, $W'_n$.

$$W_n = W + W'_n$$

where:
$W = \delta_n[W_n]$ = the expected value of $W_n$.

Taking the expected value of both sides of the recursive equation for $W_{n+1}$ and applying the substitution indicated above yields the following:

$$W = \delta_n \left[ \left( I - \frac{B_n B_n^T}{K} \right)(W + W_n') + \right.$$

$$\left. \frac{B_n}{K} \left( \frac{2v_n}{RI_0} - b_{0n} - I^T C + 4 - 2^{1-N} + 2^{1-N} E_{2n} \right) \right]$$

The orthogonality criteria, described in the preceding discussion defining the noise, can now be applied. By examining each element of $B_n$, it is found that each term of each entry can be factored according to the orthogonality criteria and therefore has a zero expected value. (See the derivation for $B_n$ in the following section on Supporting Derivations.) The term $B_n B_n^T W'_n$ also has a zero mean since $W'_n$ has a zero mean and it contains no terms with $x_{in}$ values in common with $B_n$. This is because $W_n$ is a function only of previous $B_n$ vectors and not current vectors (see the recursion formula above for $W_n$).

$$W = \left( I - \frac{F}{K} \right) W - \frac{F_0}{K}$$

where: $F = \delta_n [B_n B_n^T]$
$F_0 = \delta_n [B_n b_{0n}]$
$W = -F^{-1} F_0$ The derivations of F and $F_0$ are given in the section on supporting derivations. By performing the matrix inversion and multiplication indicated above, W becomes:

$$W = \begin{bmatrix} A \\ 1 \\ A \\ A \end{bmatrix}$$

where: $A = \begin{bmatrix} \frac{1}{2} \\ \frac{1}{4} \\ \cdots \\ \frac{1}{2^N} \end{bmatrix}$ $G_n$ can now be rewritten in terms of W and $W'_n$ as follows:

$$G_n = 2^N \left[ \frac{v_n}{RI_0} - \frac{b_{0n} + 1}{2} - \frac{B_n^T + I^T}{2} W + \frac{5}{2} \right] -$$

$$1 + E_{2n} + 2^{N-1} I^T (W - C) - 2^{N-1} B_n^T W'_n$$

By substituting in the bit based definitions for $D_{1n}$, $D_{2n}$, and $D_{3n}$ it can be seen that:

$$G_n = 2^N \left[ \frac{v_n}{RI_0} - 2^{-N}(D_{1n} + D_{2n} + D_{3n}) + \frac{5}{2} \right] -$$

$$1 + E_{2n} + 2^{N-1} I^T (W - C) - 2^{N-1} B_n^T W'_n$$

By substituting the integer based definitions for $D_{1n}$, $D_{2n}$, and $D_{3n}$ it can be seen that:

$$G_n = 2^N \left[ \frac{v_n}{RI_0} + \frac{1}{2} \right] - A_{1n} + E_{2n} +$$

$$2^{N-1} I^T (W - C) - 2^{N-1} B_n^T W_n$$

The final output then becomes:

$$Y_n = 2^N \left[ \frac{v_n}{RI_0} + \frac{1}{2} \right] + E_{2n} + E_3 - 2^{N-1} B_n^T W_n$$

where: $E_3 = 2^{N-1} I^T (W - C)$

The first term in the above equation for $Y_n$ is the ideal desired output. The second term is the error caused by the quantization and inaccuracies of ADC2. The third term, $E_3$, is a static inaccuracy due to the deviation of actual current source values, C, from the ideal current source values, W. The last term represents a zero-mean noise error which is injected by the correction methodology. The magnitude and spectral characteristics of this noise are computed in the following discussion.

If $E_3$ is traced back to its origin in the above derivation, it is seen to come from the use of a bipolar versus unipolar application of the correction factors. $E_3$ could be eliminated by reverting to the more intuitive technique of adding a correction only when the corresponding DAC bit is turned on. Unfortunately, this leads to an additional component in the recursion equation for $W'_n$, and this additional component gives rise to a non-white noise characteristic for the final term in the above equation for $Y_n$. Since the track-and-hold will have imperfect DC performance anyway, it was determined that the small DC error, $E_3$, was preferable to having a non-white noise spectrum. Hence, the bipolar correction technique was adopted.

Computation of Noise, $B_n^T W'_n$

The spectral characteristics of the random noise portion of the output can be derived by forming the autocorrelation function of the noise, and then transforming to the frequency domain. Let the autocorrelation function, $P_m$, be defined as:

$$P_m = \delta_n [2^{N-1} W_n^T B_n B_{n-m}^T 2^{N-1} W_{n-m}]$$

By using the definition of $H_{n+1}$, adding $2^{N-1} C$ to both sides, and substituting in the decomposed representation for $W_n$, the following result is derived:

$$2^{N-1} W_{n+1} = 2^{N-1} W_n + \frac{B_n}{K} G_n$$

If $G_n$ is written as a sum of a deterministic portion plus a random portion, the expression becomes:

$$G_n = G'_n - 2^{N-1} B_n^T W'_n$$

where: $G'_n = 2^N \left[ \frac{v_n}{RI_0} + \frac{1}{2} \right] - A_{1n} + E_{2n} + E_3$ $G'_n$ is a scaler sequence which represents the corrected residual without the random algorithmic noise. In fact, by applying the definition of $A_{1n} G'_n$ can be rewritten as:

$$G'_n = E_{1n} + E_{2n} + E_3$$

$$W_{n+1} = \left(I - \frac{B_n B_n^T}{K}\right) W_n + 2^{1-N} \frac{B_n}{K} G'_n$$

Let the matrix inside the parentheses be represented by its expected value plus a zero-mean varying component, $\beta_n/K$. The expected value has already been defined in terms of F such that $$W_{n+1} = \left(I - \frac{F}{K}\right) W_n + \frac{\beta_n}{K} W_n + 2^{1-N} \frac{B_n}{K} G'_n$$

To simplify the analysis, assume that the middle term above can be ignored. The justification for this is that since $\beta_n$ is zero mean, and since $\beta_n$ and $W'_n$ do not correlate with each other by virtue of being functions of non-overlapping sets of random binary sequences, the mean value of the middle term is zero. Because of this, there is no cumulative effect due to this term when the recursion relation for $W'_n$ is expanded. As a contributor of random noise, the middle term is small compared with the third term. This is because the entire calibration methodology is dependent on applying enough averaging (i.e. making K large enough) such that the fluctuations in the correction factors, $2^{N-1}W'_n$, are very small compared with the corrected residual, $G'_n$. Using these assumption yields:

$$W_{n+1} = \left(I - \frac{F}{K}\right) W_n + 2^{1-N} \frac{B_n}{K} G'_n$$

This recursion relation can now be expanded in terms of an infinite series as follows:

$$W_n = \frac{2^{1-N}}{K} \sum_{i=0}^{\infty} \left(I - \frac{F}{K}\right)^i B_{n-i-1} G'_{n-i-1}$$

The term in parentheses is a real symmetric matrix. Therefore, there exists a unitary transformation that will diagonalize that matrix. More specifically:

$$I - \frac{F}{K} = \Phi^T \Lambda \Phi$$

where:
$\Phi^T = \Phi^{-1}$; and
$\Lambda$ is a diagonal matrix.
Substituting into the definition of $P_m$ yields:

$$P_m = \delta_n \left[\frac{1}{K^2} \left(\sum_{i=0}^{\infty} G'_{n-i} B_{n-i-1}^T \Phi^T \Lambda^i \Phi\right) B_n B_{n-m}^T \left(\sum_{j=0}^{\infty} \Phi^T \Lambda^j \Phi B_{n-m-j-1} G'_{n-m-j}\right)\right]$$

At this point the orthogonality criteria can again be applied to eliminate many of the terms in the expansion of the product of summations. Note that every term in the expansion has four factors involving $b_q$, where q takes on the values $n-i-1$, n, $n-m$, and $n-m-j-1$. Since each $b_q$ can be factored into the form described by the orthogonality criteria, it follows that the product of four of these terms can also be factored into that form unless the four subscripts appear in two equal pairs. For example: when $n = n-m$ and $n-i-1 = n-m-j-1$, the $x_q$ values are paired up in the product and the orthogonality criteria no longer holds. Therefore, terms of this type must be saved in the expected value computation. Inspection of the possible combinations shows that only the case used in the example above yields terms which do not meet the orthogonality criteria. In other words, the only terms which must be considered are those where $m=0$ and $i=j$. We can therefore rewrite $P_m$ as:

$$P_m = \begin{bmatrix} 0, \text{ if } m \neq 0 \\ \frac{1}{K^2} \sum_{i=0}^{\infty} \delta_n [G'_{n-i} B_{n-i-1}^T \Phi^T \Lambda^i \Phi B_n B_n^T \Phi^T \Lambda^i \Phi B_{n-i-1} G'_{n-i}], \text{ if } m = 0 \end{bmatrix}$$

Since $n \neq n-i-1$, for any allowable value of i, the expected value of the product $B_n B_n^T$ can be computed independently of the summation over i. For this reason we can write:

$$P_0 = \frac{1}{K^2} \sum_{i=0}^{\infty} \delta_n [G'_{n-i} B_{n-i-1}^T \Phi^T \Lambda^i \Phi F \Phi^T \Lambda^i \Phi B_{n-i-1} G'_{n-i}]$$

In the section on supporting derivations it is shown that $\Phi F \Phi^T$ is a diagonal matrix. Since $\Lambda$ is also diagonal, it follows that $\Lambda^i \Phi F \Phi^T \Lambda^i$ is a diagonal matrix, $\Gamma$, with diagonal elements $\gamma_{ij}$. Since $\Phi^T = \Phi^1$ then pre-multiplying $\Gamma$ by $\Phi^T$ and post-multiplying by $\Phi$ leaves the result unchanged, still equal to the diagonal matrix $\Gamma$. Since the elements of the vector $B_{j-i-1}$ are all equal to $\pm 1$, then pre and post multiplying by this vector yields a scaler which is simply the sum of the diagonal elements of $\Gamma$.

$$B_{n-i-1}^T \Phi^T \Gamma \Phi B_{n-i-1} = \sum_{j=1}^{3N+1} \gamma_{ij}$$

Note that this factor is independent of n and can therefore be taken outside the expected value operation. The only remaining factor inside the expected value operation is $G'_{n-i}{}^2$. This may be made independent of i by recognizing that the expected value is independent of an offset in the index. Also, the order of summation can be reversed so that the summation over i is done first.

$$P_0 = \frac{1}{K^2} \delta_n [G'_n{}^2] \sum_{j=1}^{3N+1} \sum_{i=0}^{\infty} \gamma_{ij}$$

For $K >> 1$ a very good approximation to the double summation is given in the following section on supporting derivations.

$$P_0 = \frac{G^2(3N+1)}{2K}$$

-continued where: $G = \sqrt{\delta_n[G'_n{}^2]}$

The significance of the above result for $P_0$ is that the noise injected by the claimed methodology is white and has an RMS value which is proportional to the RMS error of ADC1. The noise can be reduced to any desired level by choosing a sufficiently large value for K. However, a tradeoff exists with the time required for $W_n$ to converge to the steady state condition upon which the noise computation was based. The settling time issue will be considered next.

Transient settling time:

Most of the work has already been done to compute the transient response of the system. The question can be posed as: How long does it take for an initial inaccuracy in the correction vector, $W_n$, to decay to a negligible level? Further, what the conditions are for convergence to occur? To determine these conditions, the homogeneous portion of the recursion relationship must be examined for $W'_n$.

$$W'_{n+1} = \left(I - \frac{F}{K}\right)W_n' = \Phi^T \Lambda \Phi W_n'$$

Multiply both sides by $\Phi$ and apply the fact that $\Phi^T = \Phi^{-1}$. Also, assume that the initial perturbation in the correction vector occurs for $n=0$. The sequence of subsequent correction vectors can then be written as:

$$\Phi W'_n = \Lambda^n \Phi W'_0$$

Since $\Lambda$ is diagonal, the matrix equation above represents a set of uncoupled scaler equations of the form:

$$\phi_{in} = \lambda_i{}^n \phi_{i0}$$

where:
$\lambda_i$ = the ith entry on the diagonal of $\Lambda$; and
$\phi_{in}$ = the ith entry in the vector $\Phi W'_n$ The transient response is the summation of the independent geometric decay of $3N+1$ orthogonal vectors corresponding to the rows of $\Phi$. In order for the transient to decay ultimately to zero, it is required that $|\lambda_i| < 1$. The $\lambda_i$ values are derived in the following section on supporting derivations and are listed below.

$$\lambda_1 = 1 - \frac{1}{K}(1 - x)$$

where:
x is defined in the supporting derivations section $$\lambda_2 = 1 - \frac{1}{K}(1 + x)$$

$$\lambda_i = 1 - \frac{1}{K} \quad 3 \leq i \leq 3N + 1$$

Note that as long as K is positive and finite, and that $-1 < X < 1$, the convergence criteria are met. Also note, however, that the desire to make K large as discussed in the preceding section requires that the $\lambda_i$ values be very close to 1. In this case, the geometric decay is accurately approximated by an exponential function:

$$\phi_{in} = \phi_{i0} e^{n(\lambda_i - 1)} = \phi_{i0} e^{-\frac{n}{T_i}}$$

where:
$T_i$ is a number of samples time constant.
The time constants then become:

$$T_1 = \frac{K}{(1 - x)}$$

$$T_2 = \frac{K}{(1 + x)}$$

$$T_i = K$$

where: $3 \leq i \leq 3N + 1$

Since the value x depends on the expected values of the cross correlations of the bits from ADC1, it is a function of the statistical properties of the input signal, $v_n$. A general solution of x would require the analysis of every possible input sequence, clearly an impossible task. However, the range of x can be bounded as shown in the following section on supporting derivations so that:

$$\frac{1}{1 - \sqrt{\frac{1}{3}(1 - 4^{1-N})}} \leq \frac{1}{1 - x} \leq \frac{1}{1 - \sqrt{1 - 2^{1-N} + N4^{-N}}}$$

The value of $T_2$ is not a concern since it is always smaller than K. In summary then, the worst case time constant is $T_1$ which is stretched relative to the "normal" time constant, K, by a signal dependent factor which is bounded to the range given above. The bounds of the stretch factor are also a function of the number of bits in ADC1.

SUPPORTING DERIVATIONS $B_n$ versus $X_n$

The following equations are merely an algebraic form of the boolean equations used to represent the individual bits out of the adders which generate $D_{1n}$.

$b_{0n} = q_{1n}$
$b_{jn} = x_{jn} a_{jn} q_{j+1,n}$ where:
$1 \leq j \leq N$; and
$a_{jn}$ is the jth bit of $A_{1n}$ $q_{jn} = \frac{1}{2}[x_{jn} + a_{jn} + q_{j+1,n} - x_{jn} a_{jn} q_{j+1,n}]$ where:
$1 \leq j \leq N$ $q_{N+1,n} = x_{N+1,n}$ The bits of $D_{2n}$ are similarly expressed as:

$b_{N+1,n} = -q_{N+2,n}$ $b_{jn} = -x_{jn} x_{j-N-1,n} q_{j+1,n}$ where:
$N+2 \leq j \leq 2N+1$; and
$a_{jn}$ is the jth bit of $A_{1n}$ $q_{jn} = \frac{1}{2}[x_{jn} + x_{j-N-1,n} + q_{j+1,n} - x_{jn} x_{j-N-1,n} q_{j+1,n}]$ where:
$N+2 \leq j \leq 2N+1$
$q_{2N+2,n} = x_{N+1,n}$ The bits of $D_{3n}$ are merely a renumbering of some of the noise bits directly from $X_n$.

$b_{jn} = x_{j-N,n}$ where:
$2N+2 \leq j \leq 3N+1$.

F matrix

F is defined as the expected value of the correlations among the bits in the vector sequence $B_n$.

$F = \delta_n[B_n^T B_n] = [f_{ij}]$.

By inspecting the products of pairs of bits as defined in the section labeled "$B_n$ versus $X_n$" and applying the orthogonality criteria, most of the elements of F are found to equal zero. The only non-zero off-diagonal elements are those associated with i or j equal to N+1. These elements are listed below. The diagonal elements are all equal to 1.

$f_{N+1,1} = \delta[-\frac{1}{2}[x_{N+2,n} + x_{1n} + q_{N+3,n} -$
$x_{N+2,n}x_{1n}q_{N+3,n}]x_{1n}a_{1n}q_{2n}] = \delta[-\frac{1}{2}a_{1n}q_{2n}] =$
$\delta[-\frac{1}{4}[x_{2n} + a_{2n} + q_{3n} - x_{2n}a_{2n}q_{3n}]a_{1n}] =$
$-\frac{1}{4}\delta[a_{1n}a_{2n}] - \frac{1}{8}\delta[a_{1n}q_{3n}] = -\frac{1}{4}\delta[a_{1n}a_{2n}] - \frac{1}{8}\delta[a_{1n}a_{3n}] -$
$\ldots - \frac{1}{2^N}\delta[a_{1n}a_{Nn}]$ $f_{N+1,2} = \delta[-\frac{1}{2}[x_{N+2,n} + x_{1n} + q_{N+3,n} -$
$x_{N+2,n}x_{1n}q_{N+3,n}]x_{2n}a_{2n}q_{3n}] = \delta[-\frac{1}{4}q_{N+3,n}x_{2n}a_{2n}q_{3n}] =$
$\delta[-\frac{1}{4}[x_{N+3,n} + x_{2n} + q_{N+4,n} - x_{N+3,n}x_{2n}q_{N+4,n}]x_{2n}a_{1n}q_{3n}] =$
$-\frac{1}{8}\delta[a_{2n}q_{3n}] = -\frac{1}{8}\delta[a_{2n}a_{3n}] - \frac{1}{16}\delta[a_{2n}a_{4n}] -$
$\ldots - \frac{1}{2^N}\delta[a_{2n}a_{Nn}]$ $f_{N+1,N-1} = -\frac{1}{2^N}\delta[a_{N-1,n}a_{Nn}]$ $f_{N+1,N} = 0$ $f_{N+1,N+2} = \delta[\frac{1}{2}[x_{N+2,n} + x_{1n} + q_{N+3,n} -$
$x_{N+2,n}x_{1n}q_{N+3,n}]x_{N+2,n}x_{1n}q_{N+3,n}] = -\frac{1}{2}$ $f_{N+1,N+3} = \delta[\frac{1}{2}[x_{N+2,n} + x_{1n} + q_{N+3,n} -$
$x_{N+2,n}x_{1n}q_{N+3,n}]x_{N+3,n}x_{2n}q_{N+4,n}] =$
$\delta[\frac{1}{2}q_{N+3,n}x_{N+3,n}x_{2n}q_{N+4,n}] = -\frac{1}{4}$ $f_{N+1,2N+2} = \delta[\frac{1}{2}[x_{N+2,n} + x_{1n} + q_{N+3,n} -$
$x_{N+2,n}x_{1n}q_{N+3,n}]x_{N+2,n}] = -\frac{1}{2}$ $f_{N+1,2N+3} = \delta[-\frac{1}{2}[x_{N+2,n} + x_{1n} + q_{N+3,n} -$
$x_{N+2,n}x_{1n}q_{N+3,n}]x_{N+3,n}] = \delta[-\frac{1}{2}q_{N+3,n}x_{N+3,n}] =$
$\delta[-\frac{1}{4}[x_{N+3,n} + x_{2n} + q_{N+4,n} - x_{N+3,n}x_{2n}q_{N+4,n}]x_{N+3,n}] = -\frac{1}{4}$ The entire correlation matrix F can be written as a partitioned matrix as:

$$F = \begin{bmatrix} I & -SA & 0 & 0 \\ -A^TS^T & 1 & -A^T & -A^T \\ 0 & -A & I & 0 \\ 0 & -A & 0 & I \end{bmatrix}$$

Where I represents an $N \times N$ identity matrix and where A and S are given below. The non-zero elements of S are defined as $s_{ij} = \delta[a_{in}a_{jn}]$.

$$A = \begin{bmatrix} \frac{1}{2} \\ \frac{1}{4} \\ \frac{1}{8} \\ \ldots \\ \frac{1}{2^N} \end{bmatrix}$$

$$S = \begin{bmatrix} 0 & s_{12} & s_{13} & \ldots & s_{1N} \\ 0 & 0 & s_{23} & \ldots & s_{2N} \\ 0 & 0 & 0 & \ldots & s_{3N} \\ \ldots & \ldots & \ldots & \ldots & \ldots \\ 0 & 0 & 0 & \ldots & 0 \end{bmatrix}$$

$F_0$ Vector $F_0$ is defined as the correlation between the MSB of DAC1, $b_{0n}$, and the rest of the DAC bits, $B_n$.

$F_0 = \delta_n[b_{0n}B_n] = [f_{0i}]$ where:
i identifies a particular entry in the vector.

Again, the expected values can be formulated using the formulas in the section labeled "$B_n$ versus $X_n$", and applying the orthogonality criteria to simplify the result. A few of the entries in the matrix are computed below to establish a pattern from which $F_0$ can be written.

$f_{01} = \delta[\frac{1}{2}[x_{1n} + a_{1n} + q_{2n} - x_{1n}a_{1n}q_{2n}] \cdot [x_{1n}a_{1n}q_{2n}]] =$
$\delta[\frac{1}{2}a_{1n}q_{2n}] - \frac{1}{2} = \delta\left[\frac{1}{4}a_{1n}a_{2n} + \frac{1}{8}a_{1n}a_{3n} + \ldots + \frac{1}{2^N}a_{1n}a_{Nn}\right] - \frac{1}{2}$ $f_{01} = \delta[\frac{1}{2}[x_{1n} + a_{1n} + q_{2n} - x_{1n}a_{1n}q_{2n}] \cdot [x_{2n}a_{2n}q_{3n}]] =$
$\delta[\frac{1}{4}[x_{2n} + a_{2n} + q_{3n} - x_{2n}a_{2n}q_{3n}] \cdot [x_{2n}a_{2n}q_{3n}]] =$
$\delta[\frac{1}{4} a_{2n}q_{3n}] - \frac{1}{4} = \delta\left[\frac{1}{8} a_{2n}a_{3n} + \frac{1}{16} a_{2n}a_{4n} + \right.$
$\left. \ldots + \frac{1}{2^N} a_{2n}a_{Nn}\right] - \frac{1}{4}$ $f_{0,N-1} = \delta\left[\frac{1}{2^N} a_{N-1,n}a_{Nn}\right] - \frac{1}{2^{N-1}}$ $f_{0N} = -\frac{1}{2^N}$ $f_{0,N+1} = \delta[-\frac{1}{2}[x_{1n} + a_{1n} + q_{2n} - x_{1n}a_{1n}q_{2n}] \cdot$ -continued
$$[x_{N+2n} + x_{1n} + q_{N+3,n} - x_{N+2,n}x_{1n}q_{N+3,n}]] =$$

$$-\tfrac{1}{8}\delta[q_{2n}q_{N+3,n}] - \tfrac{1}{4} + \tfrac{1}{8}\delta[a_{1n}q_{2n}] = -\frac{1}{16}\delta[q_{3n}q_{N+4,n}] -$$

$$\frac{1}{16} - \tfrac{1}{4} + \tfrac{1}{8}\delta[a_{1n}q_{2n}] + \frac{1}{16}\delta[a_{2n}q_{3n}] = -\sum_{i=1}^{N} 4^{-i} -$$

$$4^{-N} + \tfrac{1}{8}\delta[a_{1n}q_{2n}] + \frac{1}{16}\delta[a_{2n}q_{3n}] + \ldots +$$

$$\frac{1}{2^{N-1}}\delta[a_{N-1,n}q_{Nn}]$$

All elements $f_{0i}$ for $i > N+1$ are equal to zero due to the orthogonality criteria. The terms of the form $\delta[a_{in}q_{jn}]$ can be expanded into sums of the form $\Sigma s_{ij}$. See the section on the derivation of F for this expansion. This allows $F_0$ to be expressed in matrix form using the definitions for A and S given in the previous section.

$$F_0 = \begin{bmatrix} SAA \\ A^T SA - A^T A - 4^{-N} \\ 0 \\ 0 \end{bmatrix}$$

The term $-4^{-N}$ can be expressed as a function of A by noting the following:

$$\sum_{i=1}^{\infty} 4^{-i} = \tfrac{1}{3} + \sum_{i=2}^{\infty} 4^{-i} = \tfrac{1}{3} + \tfrac{1}{4}\sum_{i=1}^{\infty} 4^{-i} = \tfrac{1}{3}$$

$$A^T A = \sum_{i=1}^{N} 4^{-i} = \sum_{i=1}^{\infty} 4^{-i} - \sum_{i=N+1}^{\infty} 4^{-i} =$$

$$\sum_{i=1}^{\infty} 4^{-i}(1 - 4^{-N}) = \frac{1 - 4^{-N}}{3} \rightarrow 4^{-N} = 3A^T A - 1$$

Therefore $F_0$ can be written as:

$$F_0 = \begin{bmatrix} SA - A \\ A^T SA - 2A^T A - 1 \\ 0 \\ 0 \end{bmatrix}$$

Inversion of F to get $F^{-1}$

A convenient way to invert the correlation matrix is to assume a solution, multiply by F and force the result to be the identity matrix. This generates a set of simultaneous equations from which the elements of the inverse can be calculated. Since F is symmetric, the inverse must also be symmetric. Therefore let:

$$\begin{bmatrix} I & -SA & 0 & 0 \\ -A^T S^T & 1 & -A^T & -A^T \\ 0 & -A & I & 0 \\ 0 & -A & 0 & I \end{bmatrix} \begin{bmatrix} M_1 & V & \ldots & \ldots \\ V^T & k & \ldots & \ldots \\ M_2 & V_2 & \ldots & \ldots \\ M_3 & V_3 & \ldots & \ldots \end{bmatrix} = I$$

The last two columns of the inverse are not computed since the inverse is only being used to multiply by $F_0$, and the elements of $F_0$ multiplied by these columns are zero. Since there are seven unknowns to find in the inverse, seven independent equations must be generated from the identity above.

$$M_1 - SAV^T = I$$
$$V - SAk = 0$$
$$-A^T S^T V + k - A^T V_2 - A^T V_3 = 1$$
$$-AV^T + M_2 = 0$$
$$-AV^T + M_3 = 0$$
$$-Ak + V_2 = 0$$
$$-Ak + V_3 = 0$$

Solving this set of equations yields the following:

$$V = SAk$$
$$V_2 = V_3 = Ak$$
$$M_1 = I + kSAA^T S^T$$
$$M_2 = M_3 = kAA^T S^T$$

$$k = 1/(1 - 2A^T A - A^T S^T SA) = \frac{1}{1 - x^2}$$

where:
$$x^2 = 2A^T A + A^T S^T SA$$

The inverse exists as long as $x \neq \pm 1$. The extremes of the range of x correspond to the extremes of $A^T S^T SA$. The maximum value of $A^T S^T SA$, labeled $s_{max}$, occurs when all non-zero entries of S are the same sign and are their maximum magnitude ($+1$ or $-1$).

$$\begin{aligned} MAX[x^2] &= 2\sum_{i=1}^{N-1} 4^{-i} + \sum_{i=1}^{N-1}\left[\sum_{j=i+1}^{N} 2^{-j}\right]^2 \\ &= 2\sum_{i=1}^{N-1} 4^{-i} + \sum_{i=1}^{N-1}[2^{-i} - 2^{-N}]^2 \\ &= 3\sum_{i=1}^{N-1} 4^{-i} - 2^{1-N}\sum_{i=1}^{N-1} 2^{-i} + \sum_{i=1}^{N-1} 4^{-N} \\ &= (1 - 4^{1-N}) - 2^{1-N}(1 - 2^{1-N}) + (N-1)4^{-N} \\ &= 1 - 2^{1-N} + N4^{-N} \end{aligned}$$

For all finite $N > 0$ the maximum value of $x^2$ is positive and less than 1, indicating that x is real, positive and less than 1. The minimum value of $x^2$ occurs when $S = 0$, in which case, $$MIN[x^2] = 2\sum_{i=1}^{N-1} 4^{-i} = \tfrac{2}{3}(1 - 4^{1-N})$$

For all finite $N > 0$ the minimum value of $x^2$ is positive and less that 1, indicating that x is real, positive and less than 1. Since both the minimum and maximum of x are bounded between 0 and $<1$, it is not possible for x to equal 1 for any valid matrix S. Therefore the inverse $F^{-1}$ always exists.

W computation:

The multiplication of $-F^{-1}F_0$ to get the expected value of the bit weighting vector is straight forward once we have values for $F^{-1}$ and $F_0$.

$$W = \begin{bmatrix} I + kSAA^T S^T & kSA \\ kA^T S^T & k \\ kAA^T S^T & kA \\ KAA^T S^T & kA \end{bmatrix} \begin{bmatrix} A - SA \\ 1 - 2A^T A - A^T SA \end{bmatrix} = \begin{bmatrix} W_1 \\ W_2 \\ W_3 \\ W_4 \end{bmatrix}$$

$$W_1 = A - SA + kSAA^T A - kSAA^T S^T SA + kSA -$$

$$2kSAA^T A - kSAA^T SA = A - SA + kSA(1 - 2A^T A -$$

$$A^T S^T SA) = A$$

-continued
$$W_2 = kA^TS^TA - kA^TS^TSA + k - 2kA^TA - kA^TSA =$$
$$k(1 - 2A^TA - A^TS^TSA) = 1$$
$$W_3 = W_4 = AW_2 = A$$
$$W = [\tfrac{1}{2}\tfrac{1}{2}\ldots\tfrac{1}{2}^N 1 \tfrac{1}{2}\tfrac{1}{2}\ldots\tfrac{1}{2}^N \tfrac{1}{2}\tfrac{1}{2}\ldots\tfrac{1}{2}^N]^T$$

Λ computation:
Λ was defined as a diagonal matrix which satisfied the relationship $$I - \frac{F}{K} = \Phi^T \Lambda \Phi$$

where:
$\Phi^T = \Phi^{-1}$; and
Λ is a diagonal matrix.

By defining the ith column of $\Phi^T$ as $\Phi_i$, and the ith entry on the diagonal of Λ as $\lambda_i$, the vector $(I - F/K)\Phi_i$ can be written as:

$$\left(I - \frac{F}{K}\right)\Phi_i = \Phi_i \lambda_i = \lambda_i \Phi_i$$

or equivalently $$\left(I - \lambda_i I - \frac{F}{K}\right)\Phi_i = 0$$

Since Φ is defined to have an inverse, none of the columns of $\Phi^T$ can be identically zero. Therefore, the only way the above equality can hold for a non-zero vector $\Phi_i$ is for the matrix in the parentheses to have a rank which is smaller than its dimension. This can only occur when the determinant of the matrix equals zero. Each of the $\lambda_i$ values therefore becomes the root of the following equation in λ.

$$|KI - K\lambda I - F| = 0$$

To simplify the notation let $z = K - K\lambda - 1$, and let $I_N$ be the N×N identity matrix. The above determinant can then be written as:

$$\begin{vmatrix} zI_N & SA & 0 & 0 \\ A^TS^T & z & A^T & A^T \\ 0 & A & zI_N & 0 \\ 0 & A & 0 & zI_N \end{vmatrix} = 0$$

This determinant can be expanded by multiplying the entries in the column without any zeros by their co-factors and summing the results. After performing this operation the following equation in λ is generated.

$$z^{3N+1} - z^{3N-1}x^2 = 0$$

where:

$$x = \sqrt{2A^TA + A^TS^TSA}$$

as described in the preceding section.
This equation has 3N−1 roots at z=0, and roots at z=±x. By substituting these roots back into the equation which defines z, $\lambda_i$ is determined. The ordering of the roots is of no significance as long as the corresponding characteristic vectors, $\Phi_i$, are ordered in the same way.

$$\lambda_1 = 1 - \frac{1}{K}(1 - x)$$

$$\lambda_2 = 1 - \frac{1}{K}(1 + x)$$

$$\lambda_i = 1 - \frac{1}{K}$$

where:
$3 \leq i \leq 3N+1$.

Φ Calculation:
Each row of Φ is a characteristic vector corresponding to the characteristic values, $\lambda_i$, in the following equation:

$$\left(I - \lambda_i I - \frac{F}{K}\right)\Phi_i = 0$$

Substituting in $\lambda_1$, $\Phi_1$ can be determined as follows:

$$\left(I - I\left(1 - \frac{1}{K}(1 - x)\right) - \frac{F}{K}\right)\Phi_i = 0$$

$$(xI + F - I)\Phi_1 = 0$$

Writing out this matrix equation explicitly yields:

$$\begin{bmatrix} xI_N & -SA & 0 & 0 \\ -A^TS^T & x & -A^T & -A^T \\ 0 & -A & xI_N & 0 \\ 0 & -A & 0 & xI_N \end{bmatrix} \begin{bmatrix} V_1 \\ v \\ V_2 \\ V_3 \end{bmatrix} = 0$$

where: $\Phi_1 = \begin{bmatrix} V_1 \\ v \\ V_2 \\ V_3 \end{bmatrix}$

Performing the indicated multiplication gives four equations in the four unknowns which comprise $\Phi_1$.

$$xV_1 = vSA$$

$$A^TS^TV_1 + A^TV_2 + A^TV_3 = vx$$

$$xV_2 = vA$$

$$xV_3 = vA$$

Multiplying the second equation by x and making the substitutions indicated in the other three equations yields $$vA^TS^TSA + vA^TA + vA^TA = vx^2$$

This equation is independent of the value of v and is nothing more than a restatement of the definition of $x^2$. Therefore, the second equation is not independent of the other three. Consequently v can be selected arbitrarily while still solving the characteristic equation.

$$\Phi_1 = \frac{v}{x}\begin{bmatrix} SA \\ x \\ A \\ A \end{bmatrix}$$

However, the additional constraint that $\Phi^T = \Phi^{-1}$ implies that $\Phi_1^T \Phi_1 = 1$.

$$v^2(A^T S^T SA + x^2 + 2A^T A) = x^2$$

$$v = \frac{1}{\sqrt{2}}$$

Substituting in this value for v, and performing the same analysis for $\Phi_2$, yields:

$$\Phi_1 = \frac{1}{x\sqrt{2}}\begin{bmatrix} SA \\ x \\ A \\ A \end{bmatrix}$$

$$\Phi_2 = \frac{1}{x\sqrt{2}}\begin{bmatrix} SA \\ -x \\ A \\ A \end{bmatrix}$$

-continued $$\Phi_i = \frac{1}{x\sqrt{2}}\begin{bmatrix} V_{1i} \\ 0 \\ V_{2i} \\ V_{3i} \end{bmatrix}$$

where: $3 \leq i \leq 3N + 1$

Additional constraints on the $\Phi_i$ for $i \geq 3$ are that they be orthogonal to $\Phi_1$ and $\Phi_2$, and that they have unit magnitude—i.e. $\Phi_i^T \Phi_i = 1$.

Calculation of $\Phi F \Phi^T$ $$g\Phi F = \frac{1}{x\sqrt{2}} \begin{bmatrix} A^T S^T & x & A^T & A^T \\ A^T S^T & -x & A^T & A^T \\ V_{1i}^T & 0 & V_{2i}^T & V_{3i}^T \\ \cdots & \cdots & \cdots & \cdots \end{bmatrix} \begin{bmatrix} I & -SA & 0 & 0 \\ -A^T S^T & 1 & -A^T & -A^T \\ 0 & -A & I & 0 \\ 0 & -A & 0 & I \end{bmatrix}$$

$$= \frac{1}{1x\sqrt{2}} \begin{bmatrix} (1-x)A^T S^T & (1-x)x & (1-x)A^T & (1-x)A^T \\ (1+x)A^T S^T & (1+x)x & (1+x)A^T & (1+x)A^T \\ V_{1i}^T & 0 & V_{2i}^T & V_{3i}^T \\ \cdots & \cdots & \cdots & \cdots \end{bmatrix}$$

$$\Phi F \Phi^T = \Phi F \frac{1}{x\sqrt{2}} \begin{bmatrix} SA & SA & V_{1i} & \cdots \\ x & -x & 0 & \cdots \\ A & A & V_{2i} & \cdots \\ A & A & V_{3i} & \cdots \end{bmatrix}$$

$$\Phi F \Phi^T = \begin{bmatrix} 1-x & 0 & 0 & \cdots \\ 0 & 1+x & 0 & \cdots \\ 0 & 0 & 1 & \cdots \\ \cdots & \cdots & \cdots & \cdots \end{bmatrix}$$

Calculation of $\Sigma\Sigma\gamma_i$

Let: $R = \sum_{i=0}^{\infty} \Lambda^i \Phi F \Phi^T \Lambda^i$

Because $\Lambda$ is diagonal and because $\Phi F \Phi^T$ is diagonal, the summation of the products of these matrices is also diagonal. Let the ith element of the diagonal of R be denoted as $R_i$. Then from the previous results for $\Lambda$ and $\Phi F \Phi^T$ can be written:

$$R_1 = \sum_{i=0}^{\infty} \lambda_1^{2i}(1-x) = (1-x) + \sum_{i=1}^{\infty} \lambda_1^{2i}(1-x) =$$

$$(1-x) + \lambda_1^2 \sum_{i=0}^{\infty} \lambda_1^{2i}(1-x) = (1-x) + \lambda_1^2 R_1$$

Solving for $R_1$ and substiting in the value for $\lambda_1$ yields:

$$R_1 = \frac{1-x}{1-\lambda_1^2} = \frac{K^2}{2K-1+x}$$

Similar calculations show that:

$$R_2 = \frac{K^2}{2K-1-x}$$

-continued $$R_i = \frac{K^2}{2K - 1}$$

for $3 \leq i \leq 3N + 1$

Since x is bounded between 0 and 1, and since K is assumed to be a large integer, the result can be approximated as $R = KI/2$. In this case the sum of the diagonal elements is $(3N+1)/2K$.

I claim:

1. In a subranging analog-to-digital converter that includes:
   first and second analog-to-digital converters (ADCs);
   a digital-to-analog converter (DAC);
   each of said converters having an input and an output;
   an analog subtraction circuit having first and second inputs and a difference output;
   an analog signal input connected to the first input of the subtraction circuit;
   said first ADC having its input connected to the analog signal input and having its output connected to the input of the DAC;
   said DAC having its output connected to the second input of the subtraction circuit;
   said second ADC having its input connected to the difference output of the subtraction circuit; and
   means for combining the outputs of the first and second ADCs to provide a digital output signal;
   an improvement wherein the DAC comprises:
   first, second and third DACs, each having an input and an output;
   first and second digital noise sources, each having an output;
   first and second adders, each having two inputs and an output; and
   a correction circuit having a plurality of inputs and an output;
   said first adder having its first input coupled to the output of the first noise source and having its second input coupled to the output of the first ADC, said adder having its output coupled to the input of the first DAC to provide the negated sum of the first noise source output and the first ADC output thereto;
   said second adder having its first input coupled to the output of the first noise source and having its second input coupled to the output of the second noise source, said adder having its output coupled to the input of the second DAC to provide the sum of the first and second noise source outputs thereto;
   said third DAC having its input coupled to the output of the second noise source for receiving a negated noise output therefrom;
   said first, second and third DACs having their outputs coupled to the second input of the analog subtraction circuit;
   said correction circuit having a first input coupled to the output of the second ADC, a second input coupled to the output of the first adder, a third input coupled to the output of the second adder, and a fourth input coupled to the output of the second noise source; said circuit including means for compensating the digital output signal for conversion errors in the first, second and third DACs.

2. The subranging ADC of claim 1 which further includes:
   memory means for storing a conversion error associated with each of a plurality of input bits of the first, second and third DACs;
   means for combining said conversion errors in accordance with digital patterns applied to said first, second and third DACs to determine a net conversion error; and
   means for compensating the digital output signal to account for said net conversion error.

3. The subranging ADC of claim 2 which further includes:
   means for updating said stored conversion errors in accordance with the output from the second ADC.

4. In a method of analog-to-digital conversion that includes the steps:
   generating a digital approximation of an analog input signal;
   converting said digital approximation into an intermediate analog signal approximately corresponding thereto;
   producing an analog subrange signal by determining a difference between the analog input signal and the intermediate analog signal;
   generating a digital approximation of said subrange signal; and
   combining said digital approximations to yield a final output signal;
   an improvement comprising the steps:
   summing the digital approximation of the analog input signal with a first digital noise signal to yield a first sum;
   producing a first analog signal that approximately corresponds to the negative of said first sum;
   summing the first digital noise signal with a second digital noise signal to yield a second sum;
   producing a second analog signal that approximately corresponds to said second sum;
   producing a third analog signal that corresponds to the negative of the second digital noise signal; and
   summing the first, second and third analog signals to yield the intermediate analog signal.

5. The method of claim 4 which further includes:
   compensating the final output signal to remove error terms associated with the producing steps.

6. The method of claim 5 which further includes:
   characterizing said error terms during performance of the method, rather than during a dedicated calibration cycle.

7. In a method of analog-to-digital conversion that includes the steps:
   generating a digital approximation of an analog input signal;
   converting said digital approximation into an intermediate analog signal approximately corresponding thereto;
   producing an analog subrange signal by determining a difference between the analog input signal and the intermediate analog signal;
   generating a digital approximation of said subrange signal; and
   combining said digital approximations to yield a final output signal;
   an improvement comprising the steps:
   combining the digital approximation of the analog input signal with at least one digital noise signal to yield a digital combined signal;

converting the digital combined signal into a first intermediate analog signal approximately corresponding thereto using a DAC;

processing said first intermediate analog signal to remove the noise component thereof; and for at least one bit of the DAC:

correlating the final output signal with a digital value applied by the digital combined signal to said bit to note any deviation from ideal DAC behavior.

8. The method of claim 7 in which the correlating step includes:

weighting a signal corresponding to the final output signal by a factor A if the digital signal applied to said bit is a "0";

weighting a signal corresponding to the final output signal by a factor B if the digital signal applied to said bit is a "1";

determining a long term average of said weighted final output signal; and discerning a deviation between said long term average and a reference long term average that would result if the DAC had no conversion error, said deviation being a DAC conversion error.

9. The method of claim 8 in which said reference long term average equals (XA+YB) * Z, where:

X is the probability that the digital signal applied to said bit is a "0";

Y is the probability that the digital signal applied to said bit is a "1"; and

Z is the expected value of the final output signal.

10. The method of claim 8 which further includes compensating the final signal to remove the error determined by said discerning step.

11. The method of claim 8 which includes discerning a DAC conversion error for each of a plurality of DAC bits.

12. The method of claim 8 in which the discerning step includes:

maintaining a memory having stored therein a value which approximately corresponds to said conversion error;

dividing the signal corresponding to the final output signal by a large number to dilute the significance thereof;

adding a value corresponding to said diluted signal to said value stored in memory if the digital signal applied to said bit is a "0"; and subtracting a value corresponding to said diluted signal to said value stored in memory if the digital signal applied to said bit is a "1".

13. The method of claim 12 in which said dividing step comprises bit shifting said final output signal.

14. In a method of compensating conversion error in a digital-to-analog converter (DAC) used in a subranging analog-to-digital converter (ADC), said method including applying an input signal to the DAC and compensating a first signal produced by the ADC using an error term associated with said DAC input signal, an improved method for characterizing the error term comprising:

stimulating the DAC with a random signal; and
characterizing the error term by cross-correlating said first signal with the noise signal.

15. The method of claim 14 in which the random signal is a combination of a digitized approximation of an input analog signal and a noise signal.

16. The method of claim 15 which further includes:

compensating the DAC output signal to remove the noise signal component therefrom.

17. The method of claim 16 in which:

the DAC has associated therewith a plurality of error terms, one for each of a plurality of DAC input bits;

and which further includes:

decrementing the error term associated with one of said input bits by a weighted version of the ADC output signal if a "0" is applied to said input bit; and incrementing the error term associated with one of said input bits by a weighted version of the ADC output signal if a "1" is applied to said input bit.

18. The method of claim 17 which further includes: weighting the ADC output signal by bit shifting.

19. In a method of converting a desired input digital signal into an analog signal corresponding thereto, said method including stimulating a digital-to-analog converter and compensating a resultant output signal using an error term associated with the stimulus, an improvement comprising:

estimating said error term while converting the desired input digital signal into an analog signal corresponding thereto, rather than in a dedicated calibration cycle.

20. In a method of quantifying errors of signal sources in a digital-to-analog converter (DAC), an improvement wherein a reference against which the signal sources are compared is generated by:

including the DAC in an electrical system;
stimulating the DAC with a random signal; and
statistically analyzing the behavior of a signal produced by said system, wherein said statistical analysis comprises a cross-correlation analysis.

21. A compensated sampled data process comprising the steps:

providing an electronic system;
applying a sampled electronic data input signal to the electronic system;
processing the sampled electronic data signal in the electronic system to produce an output electronic signal corresponding thereto;
said processing step including perturbing the output signal in response to one or more process parameters, said perturbation causing the output electronic signal to deviate from an ideal value;
sensing the deviations in the output electronic signal from the ideal value; and
compensating the electronic system in response to said sensed deviations to counteract the perturbations that cause the output signal deviations;

wherein:

the process performed by the electronic system is ideally represented as:

$$F(X_n) = Y_n$$

where $X_n$ is an input sequence $\{x_1, x_2, x_3 \ldots\}$ and $Y_n$ is a scaler output sequence corresponding thereto;

the process performed by the electronic system, including said deviations due to one or more process parameters, is represented as:

$$F(X_n, P_n) = Y_n'$$

where $X_n$ is the input, $P_n$ is a vector representing the parameters corresponding thereto, and $Y_n'$ is the output of the actual process corresponding to $(X_n,P_n)$;
the process being such that:

$$F(X_n)=F(X_n,P)$$

where P is a fixed vector representing ideal process parameters;
the method further comprising the steps:
providing a random vector $Z_n$;
performing an operation C on $(X_n,Z_n)$ to yield an output $X_n'$;
performing the operation F on $(X_n',P_n)$ to yield an output $W_n'$;
performing an operation H on $(X_n,Z_n)$ to yield a vector output $Z_n'$; and
performing an operation D on $(W_n',Z_n')$ to yield an output $W_n$;
calculating a parameter vector $P_{n+1}$ for a next sample using the formula:

$$P_{n+1}=P_n-(W_n \cdot Z_n')/K$$

where K is a smoothing constant;
wherein:
operations C, H and D are chosen such that:

$$W_n = Y_n = F(X_n,P) = D(F(C(X_n,Z_n),P),H(X_n,Z_n))$$

and:
the sign of each element of the expected value of $[W_n Z_n']$ is the same as the sign of the corresponding element of the expected value of $[P_n - P]$.

22. The method of claim 21 in which:

$$H(X_n,Z_n) = Z_n' = Z_n.$$

23. The method of claim 21 in which:
the vector $Z_n$ has a sinle component $Z_n$;
$C(X_n,Z_n) = X_n + Z_n$; and
$D(W_n',Z_n) = W_n' - F(Z_n, P)$.

24. The method of claim 23 in which the electronic system is an amplifier with a variable gain $P_n$ and the desired gain is P such that:

$$F(X_n,P_n) = X_n \cdot P_n;$$

and
the operation D generates the output $W_n$ such that:

$$D(W_n',Z_n) = W_n = W_n' - PZ_n.$$

25. The method of claim 21 in which:
the process F is an analog-to-digital signal conversion process;
$X_n$ is an analog signal to be converted into digital form;
$Y_n$ is the digital counterpart of $X_n$;
$P_n$ is a set of adjustable parameters which models the conversion errors associated with the analog-to-digital conversion process; and
$Z_n$ is a vector of digital noise signals.

26. A method for compensating a sampled data process F by removing deviations therefrom to make it more nearly ideal, said process being ideally represented as:

$$F(X_n) = Y_n$$

where $x_n$ is an input and $Y_n$ is a scaler output corresponding thereto;
said process actually including one or more process parameters that cause the actual process to deviate from ideal so that the actual process is represented as:

$$F(X_n,P_n) = Y_n'$$

where $X_n$ is the input, $P_n$ is a vector representing the parameters for the corresponding sample, and $Y_n'$ is the output of the actual process corresponding to $(X_n,P_n)$;
the process being such that:

$$F(X_n) = F(X_n,P)$$

where P is a fixed vector representing ideal process parameters;
the method comprising the steps:
providing a random vector $Z_n$;
performing an operation C on $(X_n,Z_n)$ to yield an output $X_n'$;
performing the operation F on $(X_n',P_n)$ to yield an output $W_n'$;
performing an operation H on $(X_n,Z_n)$ to yield a vector output $Z_n'$; and
performing an operation D on $(W_n',Z_n')$ to yield an output $W_n$;
calculating the parameter vector $P_{n+1}$ for the next sample using the formula:

$$P_{n+1} = P_n - (W_n \cdot Z_n')/K$$

where K is a smoothing constant;
wherein:
operations C, H and D are chosen such that:

$$W_n = Y_n = F(X_n,P) = D(F(C(X_n,Z_n),P),H(X_n,Z_n))$$

and in which:
the sign of each element of the expected value of $[W_n Z_n']$ is the same as the sign of the corresponding element of the expected value of $[P_n - P]$;
$X_n$ comprises an analog voltage $V_n$ and three digital numbers $A1_n$, $A2_n$ and $A3_n$;
the ideal process is described as:

$$F(X_n) = V_n - A1_n = Y_n$$

where $Y_n$ is a digital output with acceptable precision;
the actual process is described by:

$$F(X_n,P_n) = V_n - A1_n + A2_n - A3_n + (P_n \cdot B_n)$$

where $B_n$ is a vector comprised of the individual bits used to encode the three digital numbers $A1_n$, $A2_n$ and $A3_n$, and $(P_n \cdot B_n)$ is a vector dot product yielding a scaler;
the random vector $Z_n$ consists of two random digital numbers, $Z_n$ comprises two random digital numbers $Z1_n$ and $Z2_n$;
the operation C generates an output $X_n'$ comprising the analog voltage $V_n$ and three digital numbers $D1_n$, $D2_n$ and $D3_n$, such that:

$$D1_n = A1_n + Z1_n$$

$D2_n = Z1_n + Z2_n$ $D3_n = Z2_n$;

the operation D generates an output $W_n$ such that:

$D(W_n', Z_n') = W_n' = W_n$;

and
the operation H generates an output $Z_n'$ comprising a vector of all the individual bits used to encode the three digital numbers $D1_n$, $D2_n$ and $D3_n$.

* * * * *